(12) United States Patent
Seningen et al.

(10) Patent No.: US 11,803,480 B2
(45) Date of Patent: Oct. 31, 2023

(54) SYSTEM CONTROL USING SPARSE DATA

(71) Applicant: Apple Inc., Cupertino, CA (US)

(72) Inventors: Michael R. Seningen, Austin, TX (US); Ben D. Jarrett, Austin, TX (US); Edward M. McCombs, Austin, TX (US); Greg M. Hess, Mountain View, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 17/662,500

(22) Filed: May 9, 2022

(65) Prior Publication Data

US 2022/0269617 A1  Aug. 25, 2022

Related U.S. Application Data

(63) Continuation of application No. 16/908,182, filed on Jun. 22, 2020, now Pat. No. 11,327,896, which is a continuation of application No. 16/124,166, filed on Sep. 6, 2018, now Pat. No. 10,691,610.

(60) Provisional application No. 62/564,235, filed on Sep. 27, 2017.

(51) Int. Cl.
| *G06F 12/10* | (2016.01) |
| *G06F 12/06* | (2006.01) |
| *G11C 11/419* | (2006.01) |
| *G06F 17/16* | (2006.01) |
| *G11C 7/10* | (2006.01) |
| *G11C 5/14* | (2006.01) |
| *G11C 8/06* | (2006.01) |

(52) U.S. Cl.
CPC ............. *G06F 12/10* (2013.01); *G06F 12/06* (2013.01); *G06F 17/16* (2013.01); *G11C 5/144* (2013.01); *G11C 5/148* (2013.01); *G11C 7/1006* (2013.01); *G11C 8/06* (2013.01); *G11C 11/419* (2013.01)

(58) Field of Classification Search
CPC ...... G06F 12/06; G06F 12/10; G06F 12/1408; G11C 7/1006; G11C 11/419
See application file for complete search history.

(56) References Cited

U.S. PATENT DOCUMENTS

| 8,156,341 | B2* | 4/2012 | Lee .................. G06F 21/32 713/186 |
| 8,711,015 | B2 | 4/2014 | Mustiere et al. |
| 8,775,495 | B2 | 7/2014 | Lumsdaine et al. |
| 9,367,519 | B2 | 6/2016 | Strauss et al. |
| 9,436,402 | B1* | 9/2016 | De Santis ........... G06F 12/0802 |
| 9,864,769 | B2* | 1/2018 | Sanvido ................ G06F 3/0641 |

(Continued)

*Primary Examiner* — Aracelis Ruiz
(74) *Attorney, Agent, or Firm* — Kowert, Hood, Munyon, Rankin & Goetzel, P.C.; Dean M. Munyon

(57) ABSTRACT

A method and apparatus for storing and accessing sparse data is disclosed. A sparse array circuit may receive information indicative of a request to perform a read operation on a memory circuit that includes multiple banks. The sparse array circuit may compare an address included in the received information to multiple entries that correspond to address locations in the memory circuit that store sparse data. In response to a determination that that the address matches a particular entry, the sparse array may generate one or more control signals that may disable the read operation, and cause a data control circuit to transmits the sparse data pattern.

14 Claims, 25 Drawing Sheets

(56) References Cited

U.S. PATENT DOCUMENTS

| | | | |
|---|---|---|---|
| 2004/0250042 A1* | 12/2004 | Mehta | G06F 9/345 |
| | | | 712/E9.067 |
| 2007/0113042 A1 | 5/2007 | Adcock | |
| 2007/0198621 A1 | 8/2007 | Lumsdaine et al. | |
| 2008/0056017 A1* | 3/2008 | Suzuki | G11C 7/1006 |
| | | | 341/83 |
| 2015/0161399 A1* | 6/2015 | Mylly | G06F 21/79 |
| | | | 726/30 |
| 2016/0070918 A1* | 3/2016 | Ciordas | G06F 21/79 |
| | | | 726/27 |
| 2018/0239920 A1* | 8/2018 | Gupta | G06F 21/6218 |
| 2018/0373850 A1* | 12/2018 | Morgan | G06F 12/145 |

* cited by examiner

SYSTEM CONTROL USING SPARSE DATA

PRIORITY INFORMATION

The present application is a continuation of U.S. application Ser. No. 16/908,182, entitled "System Control Using Sparse Data," filed on Jun. 22, 2020 (now U.S. Pat. No. 11,327,896), which is a continuation of U.S. application Ser. No. 16/124,166, entitled "System Control Using Sparse Data," file on Sep. 6, 2018 (now U.S. Pat. No. 10,691,610), which claims priority to U.S. Provisional App. No. 62/564,235, entitled "System Control Using Sparse Data," filed on Sep. 27, 2017, the disclosures of each are incorporated by reference herein in their entireties.

BACKGROUND

Technical Field

The embodiments described herein generally relate to computing systems, and more particularly, to storing and transmitting sparse data.

Description of the Relevant Art

Computing systems include multiple processors or processor cores that may retrieve and execute program instructions from memory. The program instructions may be part of software programs or applications, and may be designed to perform particular functions, such as word processing, sending and receiving electronic mail, and the like. During execution of such a software program, instructions included in the software program may send data to, or receive data from one or more devices included in, or coupled to, the computing system. Such data may also be stored, and later retrieved from a memory.

To facilitate the retrieval of program instructions, and the storage of data, a computing system may include multiple memories. Such memories may vary in storage capacity as well as access time. In some computing systems, memories may be arranged in a hierarchical fashion, with smaller, faster memories coupled directly to processors or processor cores, and larger, slow memory coupled to the processors or processor cores via a memory management unit and a communication or switch fabric.

In some computing systems, one or more of the included memories may be disabled when not in use in order to reduce power dissipation of the computing system. To disable such a memory, either a clock signal and/or a power supply signal may be decoupled from the memory.

SUMMARY OF THE EMBODIMENTS

Various embodiments of a computing system are disclosed. Broadly speaking, an apparatus and a method are contemplated, in which a memory circuit includes a plurality of banks, and a sparse array circuit includes a plurality of entries. A particular entry may correspond to an address location in the memory circuit where a sparse data pattern is stored. The sparse array circuit may receive information indicative of a request to perform a read operation. The request may include an address, which the sparse array circuit may compare to at least one entry of the plurality of entries. The sparse array circuit may, in response to determining that the address matches a particular entry, generate first and second control signals. The memory circuit may disable the read operation based on the first control signal, and a data control circuit may be configured to transmit the sparse data pattern on a bus coupled to the memory based on the second control signal.

In one embodiment, the sparse array circuit may be further configured to receive information indicative of a write operation, that includes a second address and write data. The sparse array circuit may be further configured to compare the write data to the sparse data pattern, and in response to a determination that the write data matches the spare data pattern, generate a third control signal and store at least part of the second address in another entry of the plurality of entries. The memory circuit may be further configured to disable the write operation based on the third control signal.

In another non-limiting embodiment, to store at least the part of the second address, the spare array circuit may be further configured to map the second address to a particular region of the memory circuit and store third information indicative of a mapping of the second address to the particular region in the another entry.

These and other embodiments will become apparent upon reference to the following description and accompanying drawings.

Figure 1:
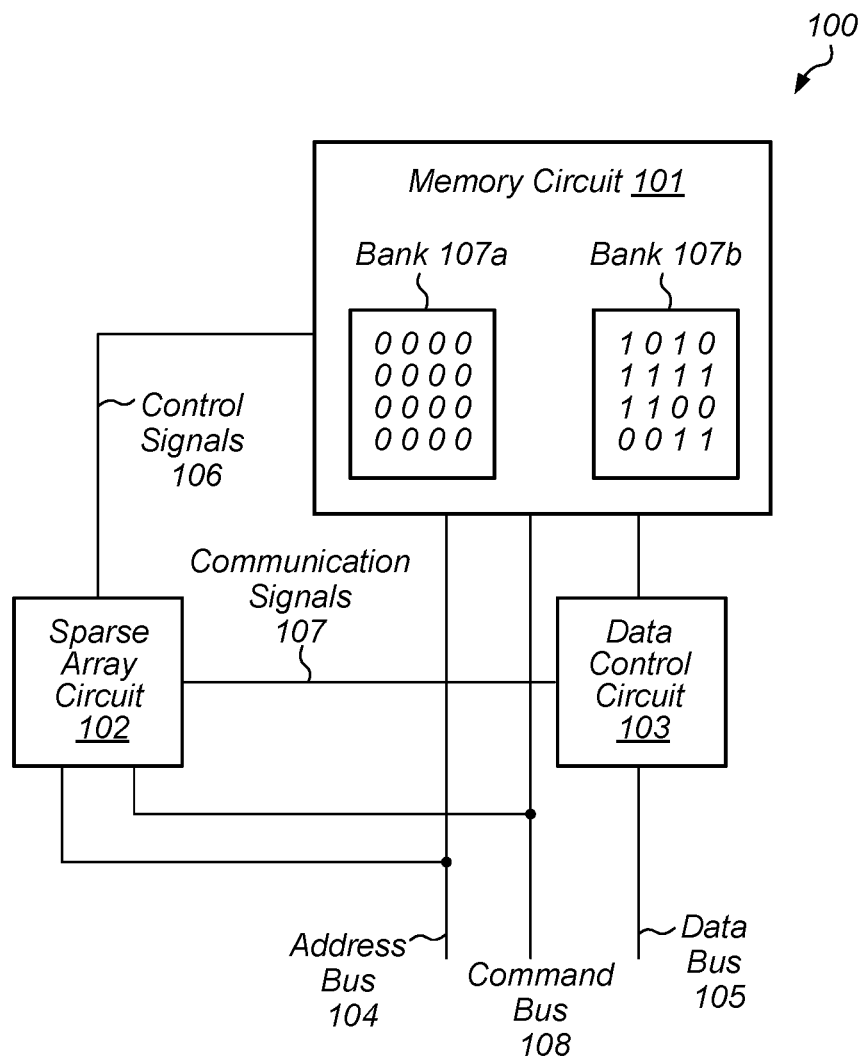
FIG. 1 is a generalized block diagram illustrating an embodiment of a memory system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

During operation of a computing system, memory circuits may store a variety of data relating to operands, instructions, graphics or other visual data, and the like. In some cases, a particular memory, or portion of a memory may store values that have a particular default value. Such data, which is often a logical-0 or null, is commonly referred to as sparse data.

As used and described herein sparse data refers to a data word whose value corresponds to a default value for a particular application or circuit block.

To reduce the power dissipation of a computing system, memory circuits may be placed in a low power state when not in use. When a particular memory circuit is accessed, the particular memory circuit is placed in an active power state, and the access, either read or write is performed. When sparse data is read from the particular memory, power is dissipated only to return the default value. The embodiments illustrated in the drawings and described below may provide techniques for storing and accessing sparse data while reducing power dissipation for a memory circuit.

An embodiment of a memory system is illustrated in FIG. 1. In the illustrated embodiment, memory system 100 includes memory circuit 101, sparse array circuit 102, and data control circuit 103. Although depicted as a distinct circuit blocks, in other embodiments, memory circuit 101, sparse array circuit 102, and data control circuit 103 may be included in a common circuit block or macrocell for inclusion in an integrated circuit or system-on-a-chip.

Memory circuit 101 includes banks 107*a* and 107*b*. In various embodiments, banks 107*a* and 107*b* include multiple data storage cells arranged as an array. The data storage cells may be static, dynamic, non-volatile, or any other suitable type of data storage cell. Different data may be stored in the different blocks. For example, in the illustrated embodiment, bank 107*a* is storing all logical-0 values, which may, in some embodiments, correspond to a particular sparse data pattern.

In some cases, memory circuit 101 may include additional circuit blocks, such as, e.g., decoder circuits, sense amplifiers, timing and control circuits, and the like, which have been omitted for clarity. Although only two blocks are depicted as being included in memory circuit 101, in other embodiments, any suitable number of blocks may be included in memory circuit 101.

Sparse array circuit 102 may be configured to receive an address via address bus 104 and a memory access command via command bus 108. In various embodiments, sparse array circuit 102 may compare the received address to one or more of multiple entries, where a given entry of the multiple entries corresponds to a particular location in memory circuit 101 where sparse data is stored, and communicate results of the comparison to memory circuit 101 via control signals 106, as well as data control circuit 103 via communication signals 107. In some cases, sparse array circuit 102 may check a sparseness status for the address and use the resulting status information in access memory circuit 101. As part of a write operation to memory circuit 101, sparse array circuit 102 may receive results of a data comparison performed by data control circuit 103 via communication signals 107.

As described below in more detail, sparse array circuit 102 may be designed according to one of various design methodologies and may include any suitable combination of logic circuits, sequential logic circuits, storage circuits, and the like.

Data control circuit 103 may be configured to received data via data bus 105, and compare the received data to a sparse data pattern, or any other suitable data pattern, during write operations. Results of the comparison may be sent to sparse array circuit 102 via communications signals 107. During read operations, data control circuit 103 may be configured to transmit the sparse data pattern to a destination via data bus 105 in response to information received from sparse array circuit 102 via communication signals 107.

In various embodiments, data control circuit 103 may include any suitable combination of logic circuits, sequential logic circuits, storage circuits, and the like, configured to perform the above-referenced tasks. In some cases, data control circuit 103 may include circuits, such as, e.g., exclusive-OR gates, configured to perform a comparison data received via data bus 105 to one or more data patterns, such as a sparse data pattern, for example.

During operation, memory system 100 may receive a memory access operation via address bus 104, data bus 105, and command bus 108. If the memory access operation is a read operation, sparse array circuit may determine if the received address corresponds to a storage location in memory circuit 101 that is storing sparse data, by comparing the received address to the multiple entries. If the address matches a particular entry of the multiple entries, sparse array circuit 102 may signal memory circuit 101 to disable the write operation via control signals 106. Sparse array circuit 102 may also, via communication signals 107, signal to data control circuit 103 to transmit the sparse data pattern on data bus 105. By intercepting accesses to sparse data in such a fashion, and halting the completion of a complete read operation, power dissipated by memory system 100 may be reduced, in some embodiments.

In the case of where the memory access is a write operation, data control circuit 103 may compare data received via data bus 105 to one or more data patterns, such as the sparse data pattern for example. If the received data matches a particular data pattern, data control circuit 103 may indicate the match to sparse array circuit 102 via communication signals 107. In response to the notification from data control circuit 103, sparse array circuit 102 may signal memory circuit 101 to halt the write operation using control signals 106. Additionally, sparse array circuit 102 may store at least part of the address corresponding to the received data in a particular entry of the multiple entries. As described below in more detail, sparse array circuit 102 may store additional information in the entry, such as, address map information, data type, and the like.

It is noted that the embodiment depicted in the embodiment of FIG. 1 is merely an example. In other embodiments, different circuit blocks and different arrangements of circuit blocks are possible and contemplated.

Figure 2:
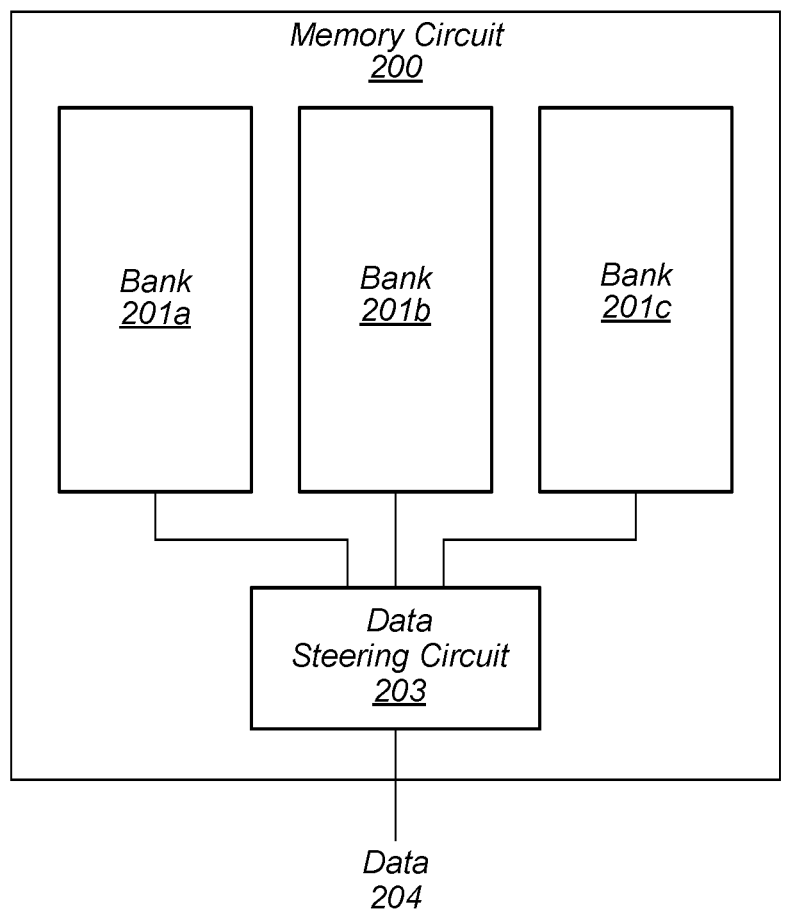
FIG. 2 illustrates a block diagram depicting an embodiment of a memory circuit.

As will be described in more detail below, sparse data may be collected in a particular region within a memory circuit. By collecting sparse data in such a fashion, the power dissipation of the memory circuit may be reduced in various embodiments. To assist in the collection of sparse data, a data steering circuit may be employed. An embodiment of memory circuit that employs a data steering circuit is illustrated in FIG. 2.

In the illustrated embodiment, memory circuit 200 includes banks 201a, 201b, and 201c, along with data steering circuit 203. In various embodiments, banks 201a-c may include multiple data storage cells arranged in columns, column selection circuits, and sense amplifier circuits. Portions of decoder circuits, and data input/output circuits may also be included in banks 201a-c. Although three banks are depicted in the embodiment of FIG. 2, in other embodiments, any suitable number of banks may be employed.

Data steering circuit 203 may be configured to direct (or "steer") data 204 to a particular bank of banks 201a-c. In some embodiments, data steering circuit 203 may select the particular bank based on control signals, such as, e.g., control signals 106 as illustrated in FIG. 1, generated by a sparse array circuit.

Data steering circuit 203 may be designed according to one of various design methodologies and may include any suitable combination of static or dynamic logic circuits configured to steer data 204 to a particular one of bank 201a-c. In some embodiments, data steering circuit 203 may include one or more complementary metal-oxide semiconductor (CMOS) pass gates.

It is noted that the embodiment of the memory circuit illustrated in FIG. 2 is merely an example, and that, for the purposes of clarity, other circuit blocks that may be included in memory circuit 200 in various embodiments, have been omitted.

Figure 3:
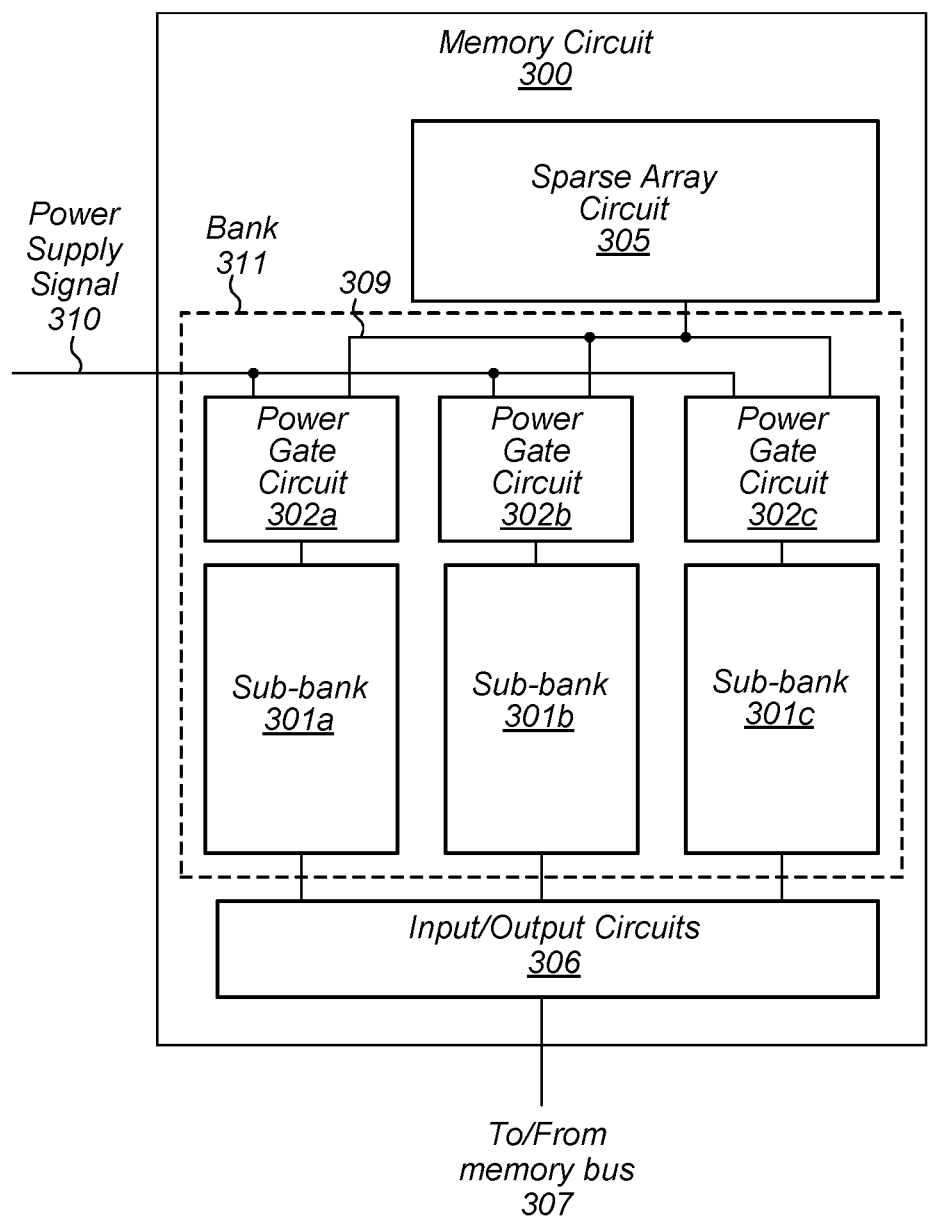
FIG. 3 illustrates a block diagram depicting another embodiment of a memory circuit.

Turning to FIG. 3, another embodiment of a memory circuit is illustrated that includes circuits for decoupling portions of a bank from a power supply signal. In the illustrated embodiment, memory circuit 300 includes bank 311, sparse array circuit 305, and input/output circuits 306.

Bank 311 includes power gate circuits 302a, 302b, and 302c, coupled to sub-banks 301a, 301b, and 301c, respectively. In various embodiments, bank 311 may correspond to either of banks 107a or 107b. Each of sub-banks 301a-c are include multiple data storage cells. Local power supply nodes included within each of sub-banks 301a-c are selectively coupled or decoupled (a process commonly referred to as "power gating") to power supply signal 310 by power gate circuits 302a-c based on control signal 309. In various embodiments, sparse array circuit 305 may generate control signal 309 based on status bits included in sparse array circuit 305 that store information indicative of an amount of sparse data stored in sub-banks 301a-c.

In some cases, a particular power gate circuit of power gate circuits 302a-c may decouple a local power supply node of a corresponding sub-bank of sub-banks 301a-c from power supply signal 310, in response to a determination by sparse array circuit 305 that the corresponding sub-bank is storing only sparse data. By decoupling a sub-bank from power supply signal 310, power dissipated by the sub-bank may be reduced in various embodiments. Although only three sub-banks and power gate circuits are illustrated in the embodiment of FIG. 2, in other embodiments, any suitable number of both sub-banks and power gate circuits may be employed.

Power gate circuits 302a-c may, in some embodiments, include one or more CMOS pass gates, or other suitable circuits, configured to selectively couple power supply signal 310 to a corresponding local power supply node of a sub-bank based upon control signal 309. It is noted that in various embodiments, power supply signal 310 may be generated by a voltage regulator or other power management circuit (not shown) located within memory circuit 300 or external to memory circuit 300.

Input/output circuits 306 are configured to receive data from memory bus 307, and relay the received data to sub-banks 301a-c. In some cases, input/output circuits 306 may include circuits configured to perform some or all of the functions associated with data control circuit 103. In various embodiments, input/output circuits 306 may include circuits configured to translate the voltage levels of signals encoding data on memory bus 307 to voltage levels employed within memory circuit 300.

Additionally, input/output circuits 306 may be configured to format data received from sub-banks 301a-c, and transmit the formatted data via memory bus 307. In some cases, data transmitted on memory bus 307 may be formatted or otherwise encoded according to one of various communication protocols. Input/output circuits 306 may, in such cases, be configured to format data received from sub-banks 301a-c according to a particular communication protocol prior to transmission, as well as translate data received via memory bus 307 from the particular communication protocol format, to a format compatible with circuits included in memory circuit 300.

Figure 4:
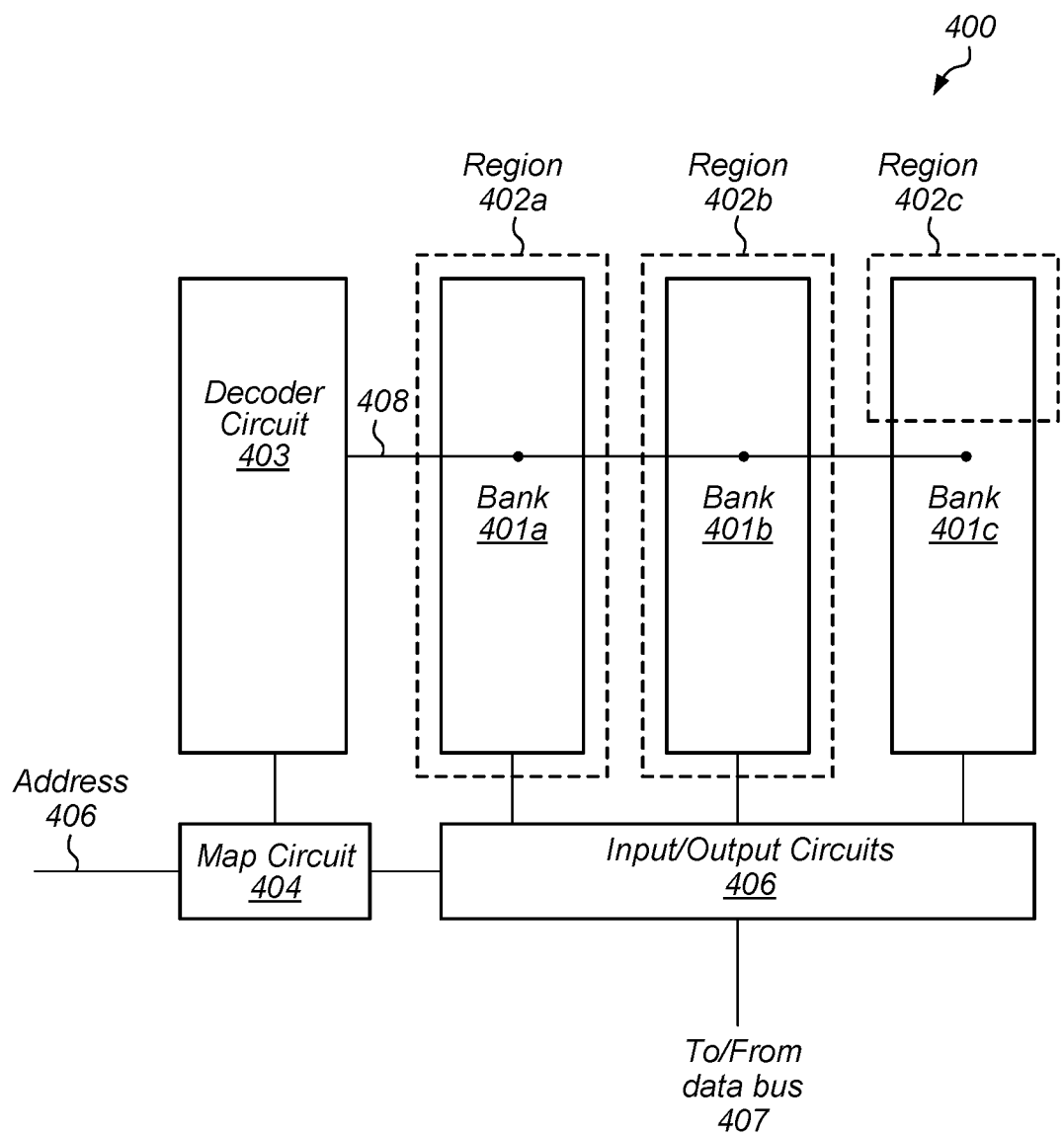
FIG. 4 illustrates a block diagram of a particular embodiment of a memory circuit.

To facilitate the aforementioned power gating operations, sparse data received by a memory circuit may be collected in a particular region within a memory circuit. As used and described herein, a region refers to a proper subset of the multiple data storage cells included in the memory circuit. For example, a region may correspond to a bank, such as, e.g., bank 107a, a portion of a block, such as, e.g., sub-block 301a, or any other suitable sub-division of the available data storage cells. To collect sparse data within a particular region, addresses associated with the received data are mapped into the collection region by a map circuit. An embodiment of a memory circuit that includes such a map circuit is illustrated in the embodiment of FIG. 4. In the illustrated embodiments, memory circuit 400 includes banks 401a-c, regions 402a-c, decoder circuit 403, map circuit 404, and input/output circuits 406.

Each of banks 401a-c may, in various embodiments, correspond to banks 107a-b as illustrated in FIG. 1, and may include multiple data storage cells, decoder circuits, sense amplifier circuits, and any other suitable circuits. Each of regions 402a-b correspond to particular portions of data storage cells. In the case of regions 402a and 402b, the regions correspond to an entire bank. Region 402c, however, corresponds to only a portion of bank 401c.

Map circuit 404 may be configured to receive address 406 as part of either a read or write operation for memory circuit 400. During a write operation, map circuit may modify the received address, in response to a determination, as performed by input/output circuit 406, that data received via data bus 407 corresponding to the received address includes sparse data. Such modifications allow the physical storage location of the received data to correspond to particular one of regions 402a-c that has been designated for storing sparse data. The modified address may then be stored within map circuit 404 along with the received address to form a portion of an address map (or simply "map"). The modified address is sent to decoder circuit 403, which activates a particular one of banks 401a-c using bank select signal 408. It is noted that although bank select signal 408 is depicted as a single wire, in other embodiments, bank select signal 408 may include any suitable number of wires.

As more data is stored in memory circuit 400, non-sparse data may be stored in regions identified as storing sparse data, reducing some of the advantages associated with storing all of the sparse data together in a particular block or region. To remediate the addition of non-sparse data in regions that include primarily sparse data, a memory circuit, such as, e.g., memory circuit 400, may re-pack previously stored data. As used and described herein, re-packing refers to a process of relocating data within a memory circuit in order to collect a specific type of data, such as, e.g., sparse data, in a particular block or region. Such re-packing processes may be performed by the memory circuit itself in response to a determination that a particular block or region is no longer storing exclusively sparse data. In other embodiments, the re-packing process may be performed by a memory controller or other processor that performs a collection of read and write operations in order to move data from one storage location in a memory circuit to another storage location in the memory circuit. It is noted that the re-packing process described above may be performed by a general-purpose processor executing software or firmware program instructions.

During a read operation, an incoming address is check against the address map. When a match is found in the address map, a mapped address corresponding to the incoming address is sent to decoder circuit 403, which, in turn, activates a particular bank using bank select signal 408.

In various embodiments, map circuit 404 may include any suitable combination of logic circuits, sequential logic circuits, state machines, and storage circuits configured to generate and store the map of addresses. Although depicted as being a separate circuit block in the embodiment of FIG. 4, in other embodiments, map circuit 404 may be included as part of a sparse array circuit located within or external to a memory circuit, such as, sparse array circuit 102 as illustrated in FIG. 1, for example.

Decoder circuit 403 is configured to receive a mapped address from map circuit 404 and decode the mapped address to generate bank select signal 408. In some embodiments, decoder circuit 403 may decode only a portion of the bits included in mapped address, and based on that decoded portion generate bank select signal 408. In other embodiments, decoder circuit 403 may decoder other portions of the mapped address to generate row and/or column selection signals (not shown).

In various embodiments, decoder circuit 403 may include any suitable combination of static, dynamic, and sequential logic circuits. Additionally, decoder circuit 403 may include one or more power gate circuits configured to decouple a local power supply node of decoder circuit 403 from a power supply signal after a portion of an address has been decoded.

Input/output circuits 406 may correspond to input/output circuits 306 as illustrated in the embodiment of FIG. 3. In various embodiments, input/output circuit 406 may be configured to perform some or all of the functions of data control circuit 103 as illustrated in the embodiment of FIG. 1.

It is noted that the embodiment depicted in the diagram of FIG. 4 is merely an example, and that other circuits blocks have been omitted for clarity.

Figure 5:
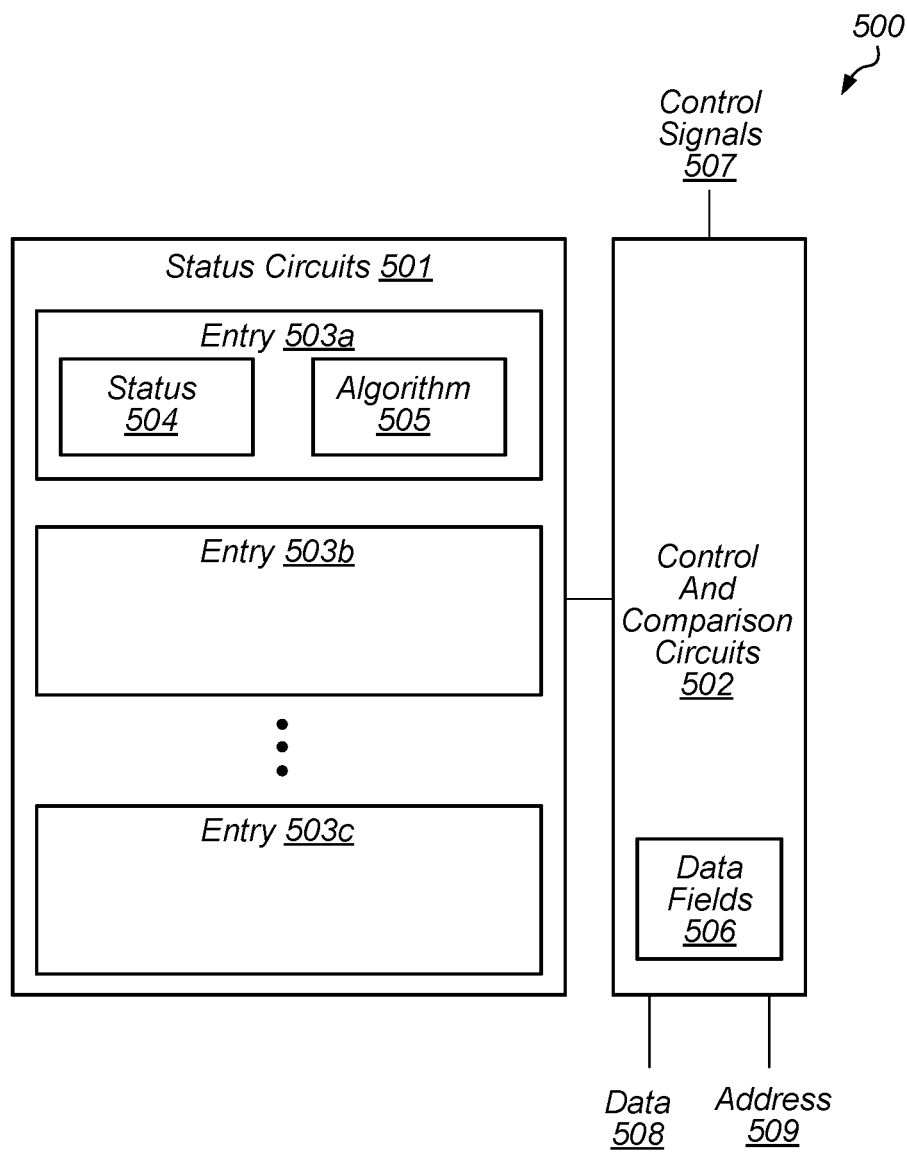
FIG. 5 illustrates a block diagram of a sparse array circuit.

As described above, control of memory operations associated with the detection of sparse data may be performed by a sparse array circuit. An embodiment of such a sparse array circuit is illustrated in the embodiment of FIG. 5. In various embodiments, sparse array circuit 500 may correspond to sparse array circuit 102 as illustrated in FIG. 1. In the illustrated embodiment, sparse array circuit 500 includes status circuits 501 and control and comparison circuits 502.

Status circuits 501 include entries 503a-503c. It is noted that although only three entries are depicted in the embodiment of FIG. 5, in other embodiments, any suitable number of entries may be employed. Each of entries 503a-c may be configured to store information corresponding to a particular address. Such information may include a circuit, such as, e.g., status 504, configured to store status information. Such status information may include data indicative of whether data associated with an address corresponding to an entry includes sparse data, or some other desired data pattern. In various embodiments, status 504 may include multiple data storage circuits, such as, latches, or flip-flops, register files, or other suitable storage circuits.

In addition to storing status information, a particular entry may include an algorithm circuit, such as, e.g., algorithm 505, configured to store information indicative of a particular algorithm used to modify data associated with the address corresponding to the particular entry. For example, algorithm 505 may store information indicative of a modification algorithm, a compression algorithm, an encryption algorithm, or any other suitable algorithm used to modify the data. In various embodiments, algorithm 505 may include multiple storage circuits, such as latches, flip-flop, register files, and the like.

It is noted that although the entries illustrated in FIG. 5 are depicted as including circuits configured to store status and algorithm information, in other embodiments, such entries may include other circuits configured to store any other suitable information.

Control and comparison circuits 502 is configured to compare address 509 to the addresses corresponding to the entries in status circuit 501. Additionally, control and comparison circuits 502 may also compare data 508 to a desired data pattern, such as, e.g., a sparse data pattern. In various embodiments, the desired data patterns may be stored in data fields 506, which may include any suitable storage circuit configured to store the desired data pattern. Based on the results of the comparisons, control and comparison circuits 502 may generate control signals 507. In various embodiments, control signals 507 may correspond to control signals 106 of the embodiments depicted in FIG. 1.

In various embodiments, control and comparison circuits 502 may include circuits configured to compare one or more bits of an address or one or more bits of a data word to a desired value. Such circuits may include one or more exclusive-OR gates, or other suitable circuits configured to perform bitwise comparison of digital words. Although depicted as a single circuit block, portions of control and comparison circuit 502 may be located separately, such as in data control circuit 103 of the embodiment illustrated in FIG. 1.

It is noted that the embodiment in FIG. 5 is merely an example. In other embodiments, different circuit blocks and different arrangements of circuits blocks are possible and contemplated.

Figure 6:
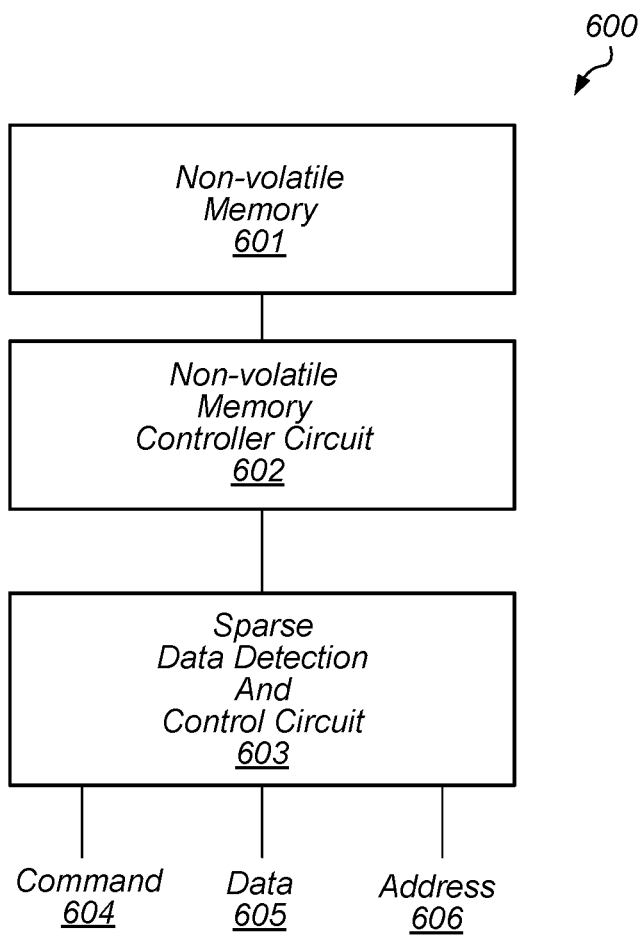
FIG. 6 illustrates a block diagram of a non-volatile memory system.

The above-described concepts may be further extended for use with non-volatile memories. An embodiment of a non-volatile memory system is illustrated in FIG. 6. In the illustrated embodiments, non-volatile memory system 600 includes non-volatile memory 601, non-volatile memory controller circuit 602, and sparse data detection and control circuit 603.

Non-volatile memory 601 may include multiple non-volatile data storage cells. For example, in various embodiments, non-volatile memory 601 may include multiple flash data storage cells, or any other suitable non-volatile data storage cells.

Non-volatile memory controller circuit 602 includes circuitry for storing and retrieving data from non-volatile memory 601. In various embodiments, non-volatile memory controller circuit 602 may include multiple analog circuits configured to generate voltage levels, different from a level of a power supply signal, that may be used to program or erase one or more non-volatile data storage cells.

Sparse data detection and control circuit 603 may include any suitable combination of logic, or sequential logic circuits configured to receive data via data 605, memory commands via command 604, and address information via 606. In response to receiving a write command, sparse data detection and control circuit 603 may examine the received data to determine whether the received data is sparse data. If the received data is sparse data, sparse data detection and control circuit 603 may note the received address as corresponding to sparse data, and halt further write (program) operations for non-volatile memory 601. By halting the write operations, power consumption of non-volatile memory system 600 may be reduced, in various embodiments. Additionally, reducing a number of write (or program) operations performed may extend a lifetime of memory cells, particularly non-volatile memory cells, which are limited to a particular number of program operations.

Additionally, sparse data detection and control circuit 603 may, in response to a read request received via command 604, determine whether the read address corresponds to sparse data. In such cases, sparse data detection and control circuit 603 may halt the read operation, and transmit the sparse data on data 605. By detecting addresses that correspond to sparse data and halting the read operations, the power consumption of non-volatile memory system 600 may be reduced, in various embodiments.

It is noted that the embodiment depicted in FIG. 6 is merely an example. In other embodiments, different circuit blocks and different arrangements of circuit blocks may be employed.

Figure 7:
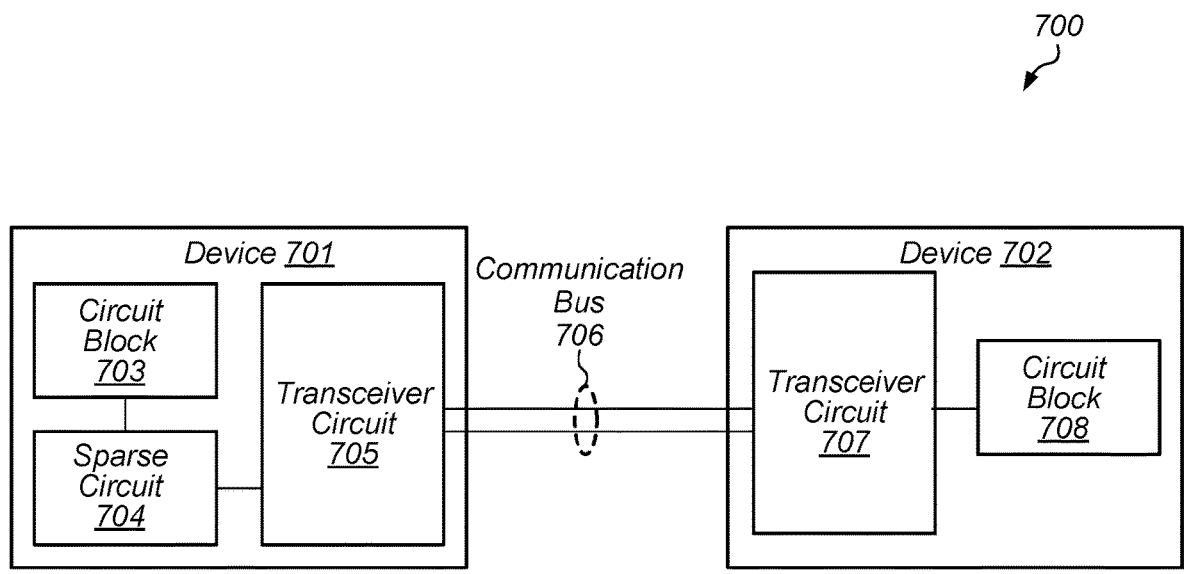
FIG. 7 illustrates a block diagram of two devices included in a computing system.

In addition to exploiting sparse data during memory accesses, communication of data between devices in a computing system may also take advantage of the detection of sparse data. An embodiment of a computing system is illustrated in FIG. 7. In the illustrated embodiment, computing system 700 includes devices 701 and 702, coupled by communication bus 706.

Device 701 includes circuit block 703, sparse circuit 704, and transceiver circuit 705. In various embodiments, circuit block 703 may be a processor, processor core, memory, or any other suitable circuit block that may be included in an integrated circuit configured to output data for transmission to device 702. Sparse circuit 704 may detect sparse data included in data output by circuit block 703.

Transceiver circuit 705 may be configured to receive data from sparse circuit 704, and transmit signals on communication bus 706 that are indicative of the data to be transmitted. In various embodiments, transceiver circuit 705 may include any suitable combination of analog and digital circuits configured to generate signals for transmission based on data received from sparse circuit 704. In some cases, the generation of signals may include encoding the data bits, converting voltage levels associated with the data bits or any other suitable processing. Upon detection of sparse data, transceiver circuit 705 may halt the processing and transmission of the sparse data, and merely transmit a signal indicative of sparse data on communication bus 706. In various embodiments, such an indicator may include one or more dedicated signal lines on communication bus 706. It is noted that although two signal lines are included in communication bus 706, in other embodiments, any suitable number of signal lines may be employed.

Device 702 includes transceiver circuit 707 and circuit block 708. Like circuit block 703, circuit block 708 may be a processor, processor core, memory, or any other suitable circuit block configured to receive data from transceiver circuit 707. Transceiver circuit 707 may include any suitable combination of analog and digital circuits configured to receive signals transmitted on communication bus 706 and convert the received signals to data bits, which may be transmitted to circuit block 708. In response to receiving the sparse data signal from transceiver circuit 705 via communication bus 706, transceiver circuit 707 may reconstruct the sparse data and send the reconstructed sparse data to circuit block 708. By handling sparse data in this fashion, power consumption of computing system 700 associated with the transmission of such sparse data may be reduced in various embodiments.

It is noted that device 701 and 702 may be fabricated on a single silicon substrate, or may be separately fabricated integrated circuits coupled together on a circuit board or other suitable substrate. Although only two devices are depicted in the embodiment of FIG. 7, in other embodiments, any suitable number of devices may be employed.

In many computing systems, data capture circuits are included in the data pathways to and from a memory circuit to allow for pipelined operation through logic circuits included in the computing system. Such data capture circuits may include latch circuit, flip-flop circuits, or any other suitable circuit configured to sample and store data based on a timing signal, such as, a clock signal for example.

When sparse data is accessed in a memory circuit, since the value of the sparse data is known, capturing the sparse data may not be desirable. In such cases, a clock or other timing signal that provides timing information to data capture circuit may be halted. By halting the clock or timing signal, power dissipated in a data capture circuit resulting from the capacitive loads being charged and discharged based on the clock or timing signal may be reduced. The process of halting a clock or timing signal is commonly referred to as "clock gating."

Figure 8:
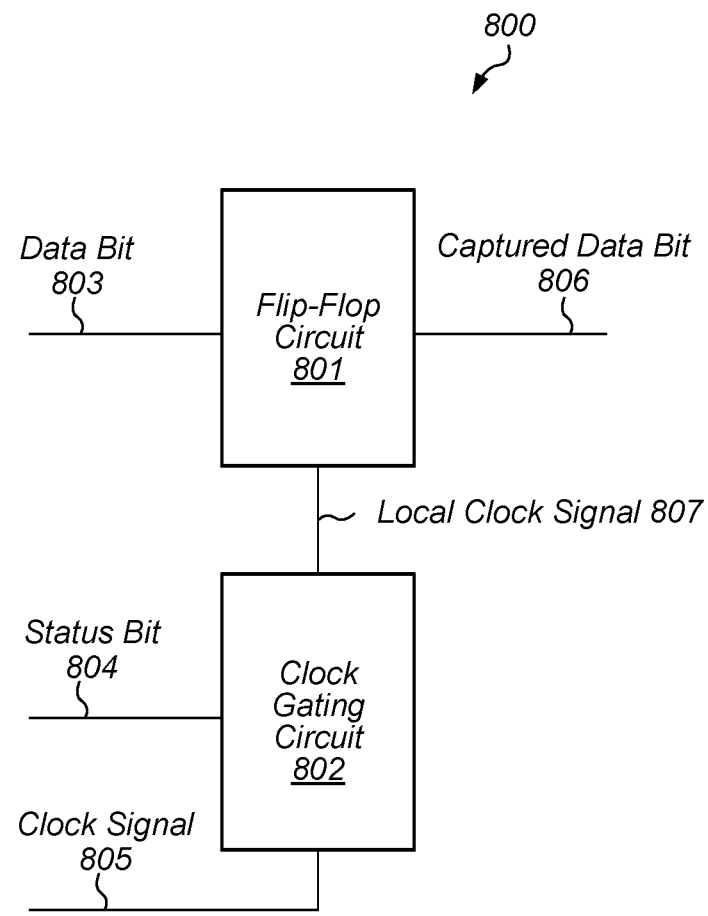
FIG. 8 illustrates a block diagram of a clock-gated flip-flop circuit.

A block diagram depicting an embodiment of a clock-gated data capture circuit is illustrated in FIG. 8. In the illustrated embodiment clock-gated data capture circuit 800 includes flip-flop circuit 801 coupled to clock gating circuit 802.

Flip-flop circuit 801 is configured to sample data bit 803 and generate captured data bit 806 using local clock signal 807. In various embodiments, flip-flop circuit 801 may include two latch circuits coupled in a serial fashion, each operating using a different phase of local clock signal 807, or any other suitable arrangement of circuits configured to sample data bit 803.

Clock gating circuit 802 may be configured to generate local clock signal 807 using clock signal 805 based on status bit 804, which may be generated by a sparse array circuit, such as sparse array circuit 102, for example. In various embodiments, clock gating circuit may include any suitable combination of logic circuits configured to halt transitions on local clock signal 807 based on a value of status bit 804. For example, if status bit 804 is at a high logic level, transitions of clock signal 805 may propagate to local clock signal 807. Alternatively, if status bit 804 is at a low logic level, local clock signal 807 may be held at a particular logic level, regardless of any transitions of clock signal 805. When local clock signal 807 is held at a particular logic level, power dissipated by flip-flop circuit 801 may be reduced, in various embodiments.

It is noted that the embodiment of a clock-gated data capture circuit illustrated in FIG. 8 is merely an example. In other embodiments, different circuit blocks, and different arrangements of circuit blocks are possible and contemplated.

As described above, when sparse data is accessed in a memory circuit, clock or timing signals controlling data capture circuits coupled to the memory circuit may be held at a particular logic level to reduce power dissipated by the data capture circuits. In some cases when sparse data is accessed, in addition to, or in conjunction with clock gating, data capture circuits may be decoupled from a power supply signal, in a process commonly referred to as "power gating."

Figure 9:
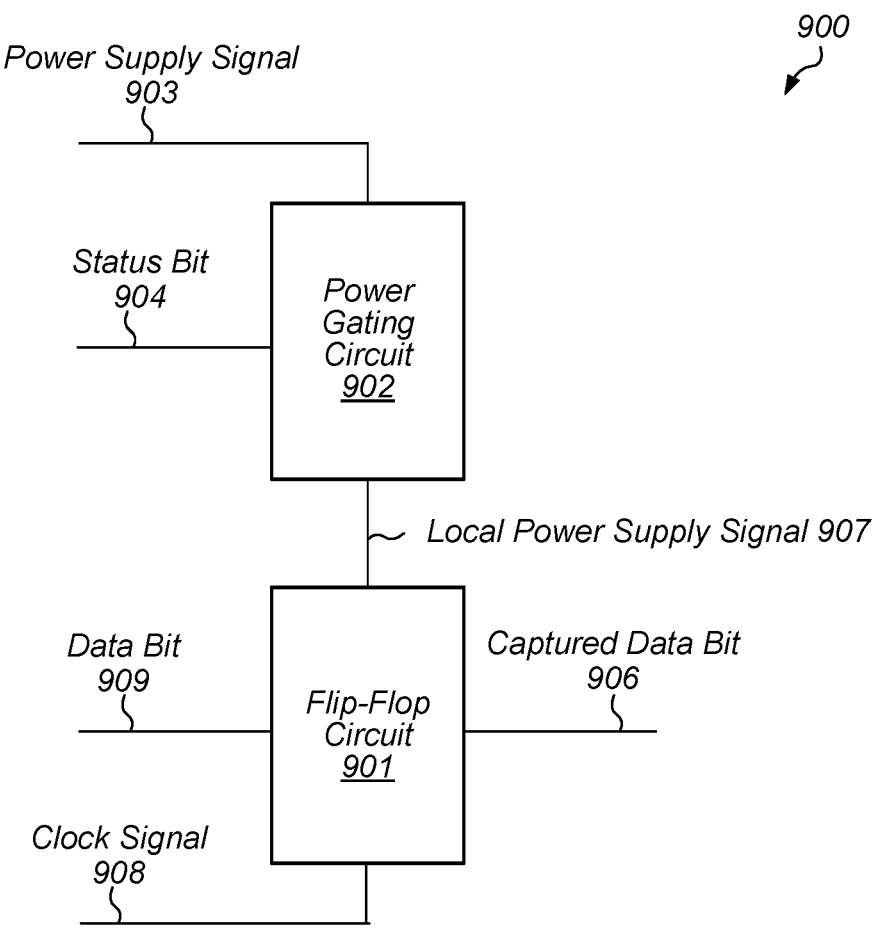
FIG. 9 illustrates a block diagram of a power-gated flip-flop circuit.

A block diagram depicting an embodiment of a power-gated data capture circuit is illustrated in FIG. 9. In the illustrated embodiment power-gated data capture circuit 900 includes flip-flop circuit 901 coupled to power gating circuit 902.

Flip-flop circuit 901 is configured to sample data bit 909 and generate captured data bit 906 using clock signal 908 and local power supply signal 907. In various embodiments, flip-flop circuit 901 may include two latch circuits coupled in a serial fashion, each operating using a different phase of clock signal 908, or any other suitable arrangement of circuits configured to sample data bit 909.

Power gating circuit 902 may be configured to generate local power supply signal 907 using power supply signal 903 based on status bit 904, which may be generated by a sparse array circuit, such as sparse array circuit 102, for example. In various embodiments, power gating circuit 902 may including any suitable combination of circuits, such as, e.g., one or more power switch circuits, configured to decouple flip-flop circuit 901 from power supply signal 903 based on a value of status bit 904. For example, if status bit 904 is at a high logic level, power gating circuit 902 may couple power supply circuit nodes included in flip-flop circuit 901 to power supply signal 903.

Alternatively, if status bit 904 is at a low logic level, power gating circuit 902 may decouple the power supply circuit nodes included in flip-flop circuit 901 from power supply signal 903. In such cases, local power supply signal 907 may be electrically isolated from power supply signal 903 and the electrical potential associated with local power supply signal 907 may be allowed to seek any particular value based on current leakage through devices, parasitic circuit elements, and the like, coupled to local power supply signal 907. When flip-flop circuit 901 is decoupled from power supply signal 903, power dissipated by flip-flop circuit 901 may be reduced, in various embodiments.

Although FIG. 8 and FIG. 9 depict clock and power gated flip-flop circuits, respectively, it is noted that in some embodiments, clock and power gating may be employed in parallel.

As described above, when storing data in a memory circuit, certain power saving measures may be taken in response to determining the data to be stored in sparse data. An embodiment of a method for storing sparse data in a memory circuit is illustrated in the flow diagram of FIG. 10. The method begins in block 1001.

Data may then be received for storage in a memory, such as memory circuit 101, for example (block 1002). In various embodiments, the data may be received by data control circuit 103, as part of a write operation, and may be received along with address information via busses, such as data bus 105 and address bus 104, respectively.

Data control circuit 103 may then compare the received data to a particular sparse data pattern (block 1003). The sparse data pattern may include any suitable combination of data bits. For example, in some cases, the sparse data pattern may include all logical-0 values. The method may then depend on results of the comparison (block 1004).

If the received data matches the sparse data pattern, sparse array circuit 102 may disable the write operation for memory circuit 101 (block 1005). In various embodiments, in addition to disable write control signals for memory circuit 101, address decoders and other circuits may also be disabled. By disabling circuits included in memory circuit 101, in this fashion, the power dissipated by memory circuit 101 may be reduced.

Sparse array circuit 102 may then be updated (block 1006). In various embodiments, the value of the address received with the data may be stored in a particular entry in the sparse array circuit, such as, e.g., entry 503*b*, as depicted in the embodiment illustrated in FIG. 5. By storing address values associated with sparse data, subsequent read accesses to sparse data may be handled differently as described below in more detail. The method may then conclude in block 1010.

Alternatively, if the received data does not match the sparse data pattern, memory circuit 101 may be powered up (block 1007). In various embodiments, a memory circuit, such as, e.g., memory circuit 101, may include multiple power switches that allow various portions of the memory circuit to be decoupled from a power supply signal when the memory circuit is not in use. Upon receiving an access command, portions of the memory circuit not coupled to the power supply signal may be re-coupled to the power supply signal to allow the access operation to be performed.

The received data may then be written to memory circuit 101 (block 1008). In various embodiments, the data may be written to a particular bank, such as, e.g., 107*a*, based upon a value of the address received along with the data. Upon completion of the write operation, memory circuit 101 may be powered down (block 1009). As described above, one or more portions of memory circuit 101 may be decoupled from a power supply signal to reduce power dissipated by memory circuit 101. The method may then conclude in block 1010.

Figure 10:
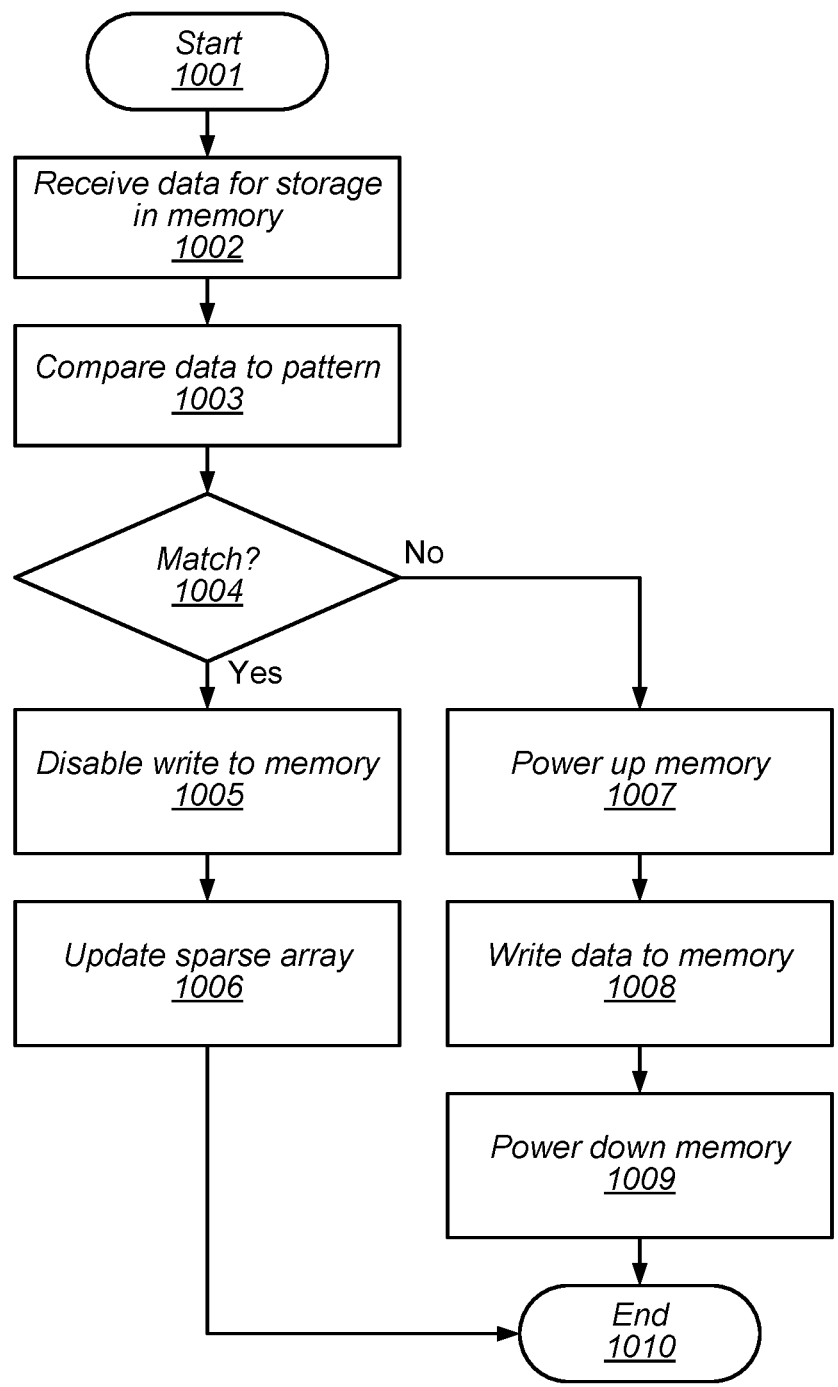
FIG. 10 illustrates a flow diagram depicting an embodiment of a method for storing data in a memory circuit.

It is noted that the embodiment of the method illustrated in the flow diagram of FIG. 10 is merely an example. In other embodiments, different operations and different orders of operations may be employed.

As mentioned above, read access operations to a memory circuit may be handled differently when information regarding sparse data has been stored. An embodiment of a method for accessing a memory circuit is illustrated in the flow diagram of FIG. 11. The method begins in block 1101.

An address may then be received to access a memory circuit, such as memory circuit 101, for example (block 1102). In various embodiments, the address may be received by sparse array circuit 102 via address bus 104.

The received address may then be compared to the entries in sparse array circuit 102 (block 1103). Sparse array circuit 102 may, in various embodiments, include multiple entries, such as, entry 503*b*, for example. The entries may include information indicative of address values associated with previously received sparse data. The method may then depend on results of the comparison (block 1104).

If the received address matches a value stored in a particular entry included in sparse array circuit 102, then the memory read operation may be disabled (block 1105). In various embodiments, sparse array circuit 102 may send a signal to memory circuit 101, which may disable address decode, generation of internal timing signals for activating sense amplifiers, and the like.

The sparse data pattern may then be transmitted on the memory data bus (block 1106). In some embodiments, sparse array circuit 102 may communicate the detection of an address corresponding to previously received sparse data to data control circuit 103, which may, in turn, transmit the sparse data pattern on data bus 105. By disabling the memory read operation and transmitting the sparse data pattern on data bus 105, the power dissipated by memory system 100 may be reduced, in various embodiments. The method may then conclude in block 1107.

Alternatively, the received address fails to may any entries in sparse array circuit 102, memory circuit 101 may be powered up (block 1108). As described above, when not in use, one or more portions of memory circuit 101 may be decoupled from a power supply signal to reduce power dissipation.

Once memory circuit 101 has been powered up, the memory read operation may be performed (block 1109). In some embodiments, memory circuit 101 may be placed into a powered down state upon completion of the memory read operation. The method may then conclude in block 1107.

Figure 11:
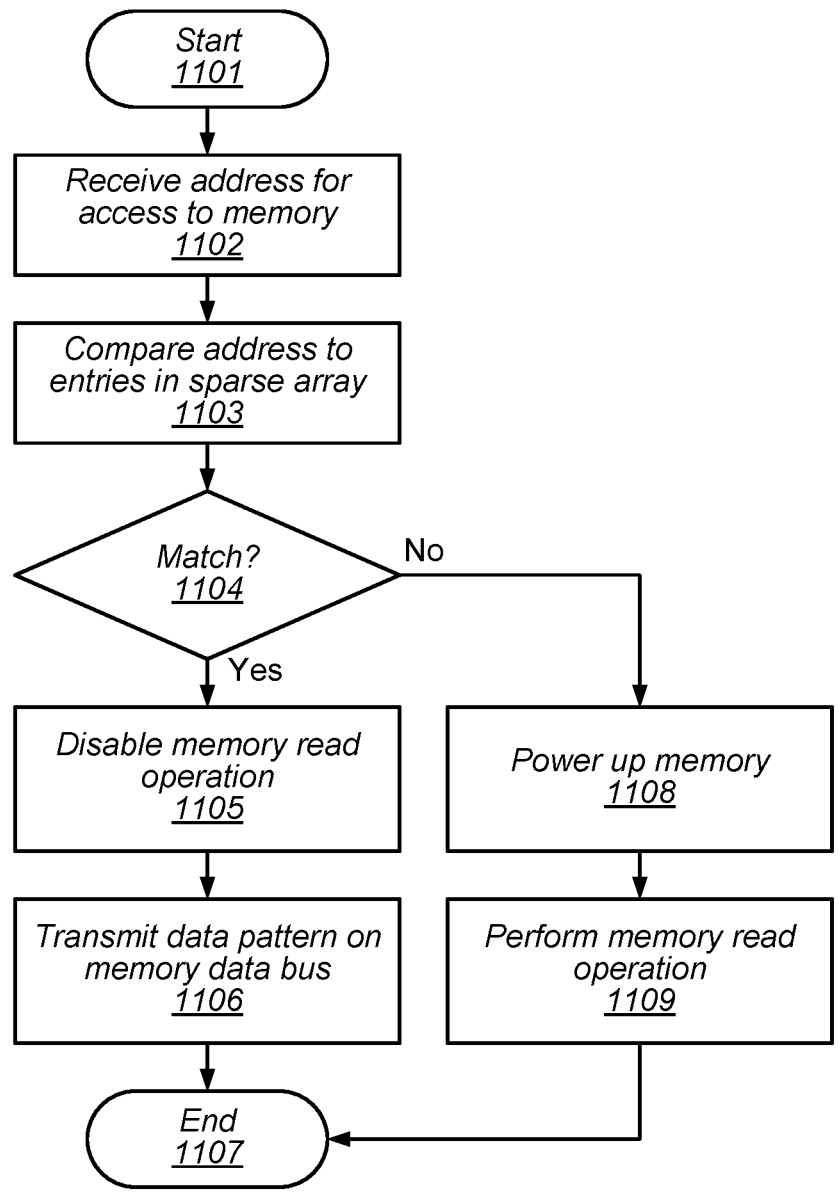
FIG. 11 illustrates a flow diagram depicting an embodiment of a method for retrieving data from a memory circuit.

It is noted that the embodiment of the method illustrated in the flow diagram of FIG. 11 is merely an example. In other embodiments, different operations are possible and contemplated.

As previously mentioned, portions of a memory circuit may be decoupled from a power supply signal when the memory circuit is not in use in order to reduce power dissipation. In order to maintain the data stored in the memory circuit, data storage cells must remain coupled to the power supply signal. If, however, sparse data can be directed to a particular region of data storage cells within a memory circuit, then that region may also may be decoupled from the power supply signal upon activation of a power down mode in order to reduce power dissipation associated with leakage current, and the like. An embodiment of a method for collecting sparse data into a particular region within a memory circuit is illustrated in the flow diagram of FIG. 12. The method begins in block 1201.

Data for storage may be received by a memory system, such as memory system 100, for example (block 1202). In various embodiments, data and an associated address may be received via respective busses, such as, address bus 104 and data bus 105, for example.

The received data may then be compared to the sparse data pattern (block 1203). In some embodiments, data control circuit 103 may perform a bitwise comparison of the received data with a predetermined data pattern. In some cases, the predetermined data pattern may correspond to a sparse data pattern. The method may then depend upon a result of the comparison (block 1204).

If the received data matches the sparse data pattern, then the address may be mapped to a collection region (block 1205). In various embodiments, a map circuit, such as, e.g., map circuit 404 may generate a mapped address based on the received address, where the mapped address corresponds to a location in a particular one of regions 402*a*, 402*b*, or 402*c*, which has been designated for collecting sparse data. It is noted that all of access requests, either read or write, may depend on the address map generated by map circuit 404.

Status bits associated with the received address may then be updated (block 1206). In various embodiments, sparse array circuit 102 may update one or more status bits, such as, e.g., status 504, included in an entry associated with the receive address. Once the status bits have been updated, the method may conclude in block 1207.

Alternatively, if the received data fails to match the sparse data pattern, the received data may then be stored in memory circuit 101 according to an address or other mapping (block 1208). In various embodiments, the address corresponding the received data may be used by a map circuit, such as, e.g., map circuit 404, to generate a mapped address. The mapped address may then be decoded by memory circuit 101 as part of the memory write operation. The method may then conclude in block 1207.

Figure 12:
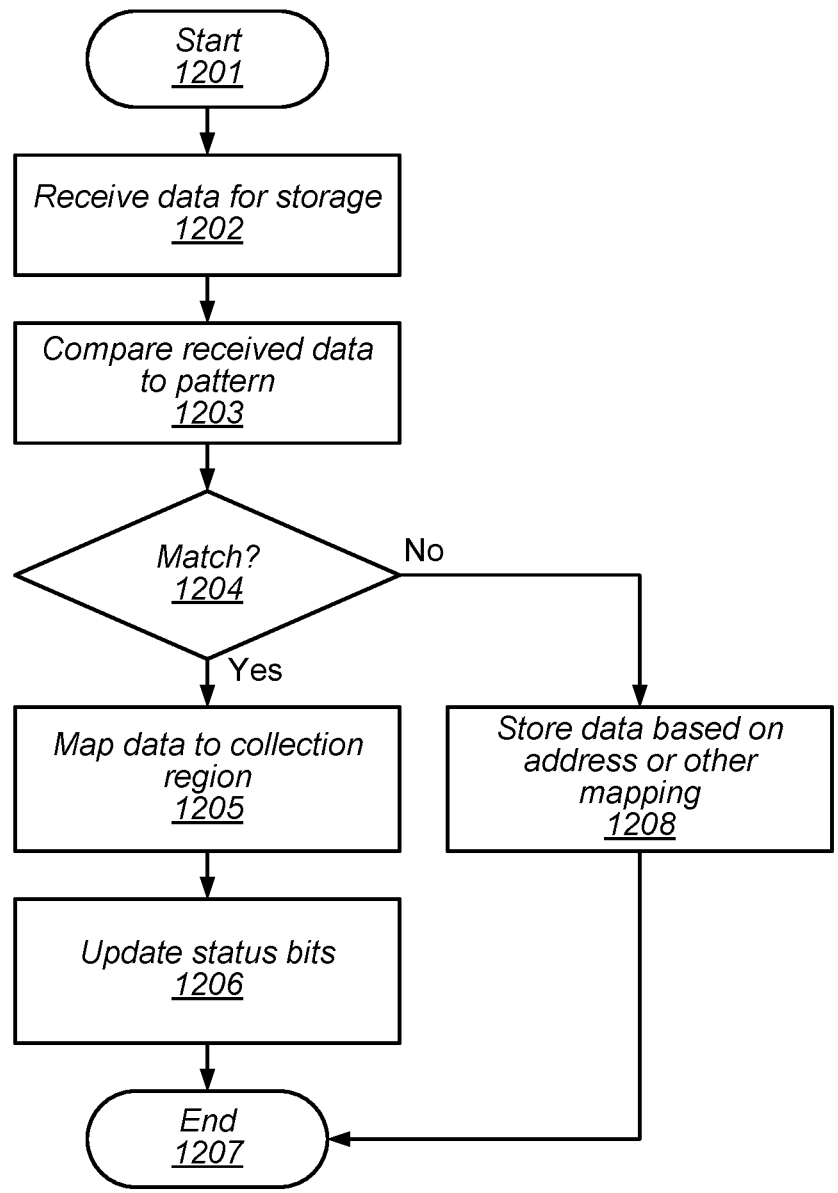
FIG. 12 illustrates a flow diagram depicting an embodiment of a method for collecting sparse data in a memory circuit.

The embodiment of the method depicted in the flow diagram of FIG. 12 is merely an example. In other embodiments, different operations and different orders of operations may be employed.

Figure 13:
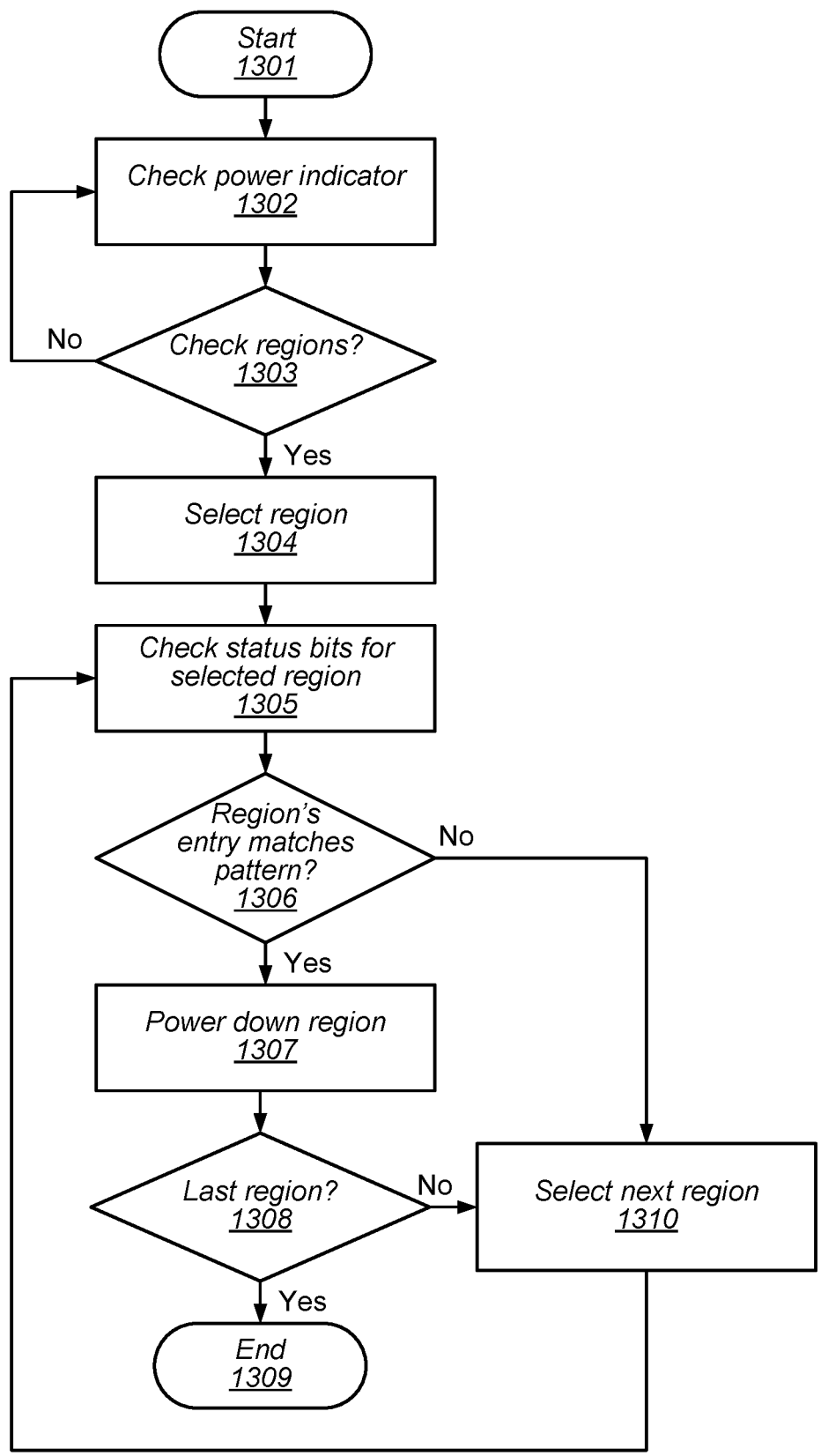
FIG. 13 illustrates a flow diagram depicting an embodiment of a method for managing power within a memory circuit.

Once sparse data has been collected into regions within a memory circuit, the regions may be decoupled from the power supply for the memory circuit in order to reduce power dissipated by the memory circuit. Turning to FIG. 13, a flow diagram depicting an embodiment for managing power within a memory circuit is illustrated. The method begins in block 1301.

A power indictor for the memory circuit may then be checked (block 1302). In various embodiments, the power indicator may include one or more data bits stored in a register or other suitable storage location. The one or more data bits may store information indicative of a power state of the memory circuit. For example, the value of the one or more data bits may indicate that the memory circuit is to be placed into a low power dissipation mode. The method may then depend on a value of the power indicator (block 1303).

If the value of the power indicator specifies that regions with the memory circuit are to be examined for possible power down, then an initial region, such as, e.g., region 402a, is selected (block 1304). Alternatively, if the value of the power indicator specifies any other condition, the method may continue from block 1302 as described above.

Once a region has been selected, status bits associated with the selected region may be checked (block 1305). In various embodiments, status bits associated with the region may be stored in a sparse array circuit, such as, e.g., sparse array circuit 102, and may store information indicative of a characteristic of data stored in a particular region. The method may then depend on the value of the status bits associated with the selected region (block 1306).

If the value of the status bits indicates that the data stored in the selected region does not match the sparse pattern, then a new region is selected (block 1310). The method may then continue from block 1305 has described above.

Alternatively, the value of the status bits indicates that the data stored in the selected region matches the sparse pattern, then the region may be powered down (block 1307). In various embodiments, a power gate circuit, such as, e.g., power gate circuit 302b, may decouple the selection region from the power supply signal. By decoupling the selection region from the power supply signal, power dissipated by the region due to leakage currents may be reduced, without fear of data loss, since the data stored in the selected region is sparse data. The method may then depend on if the currently selection region is the last region to be checked (block 1308).

If additional regions remain to be checked, then the method may proceed from block 1310 as described above. Alternatively, the currently selected region is the last region to be checked, the method may then conclude in block 1309.

The embodiment of the method depicted in the flow diagram of FIG. 13 is merely an example and, in other embodiments, different orders of operations may be employed.

In some cases, sparse array circuits and data control circuits may be used to modify data to be stored in a memory. An embodiment of a method for performing such modification is depicted in the flow diagram of FIG. 14. The method begins in block 1401.

Data may then be received for storage in a memory circuit (block 1402). In various embodiments, the received data may have an associated address, which is also received by the memory circuit as part of a memory write operation.

The received data may then be checked for compatibility of a modification algorithm (block 1403). In some embodiments, a data control circuit, such as, e.g., data control circuit 103, may perform one or more checks on the received data to determine compatibility with the modification algorithm. Although only a single modification algorithm is depicted, in other embodiments, the data may be checked against multiple modification algorithms. The method may then depend upon a result of the check (block 1404).

If it is determined the received data can be modified by the modification algorithm, then then received data is modified using the selected algorithm (block 1405). In various embodiments, the data control circuit may compress, encrypt, or perform any other suitable modification to the received data as specified by the selected modification algorithm.

The modified data may then be stored (block 1406). In various embodiments, the data may be stored in a location in the memory circuit associated with the address corresponding to the received data. Status bits associated with the address corresponding to the received data may then be updated (block 1407). In some embodiments, the status bits may be updated by a sparse array circuit, such as, e.g., sparse array circuit 102 to include information indicative of the modification algorithm use to modify the data. The method may then conclude in block 1408.

If modification of the received data is not possible, then the received data may be stored in the memory circuit (block 1409) In various embodiments, the received data may be stored in a location in the memory circuit associated with the address corresponding to the received data.

Figure 14:
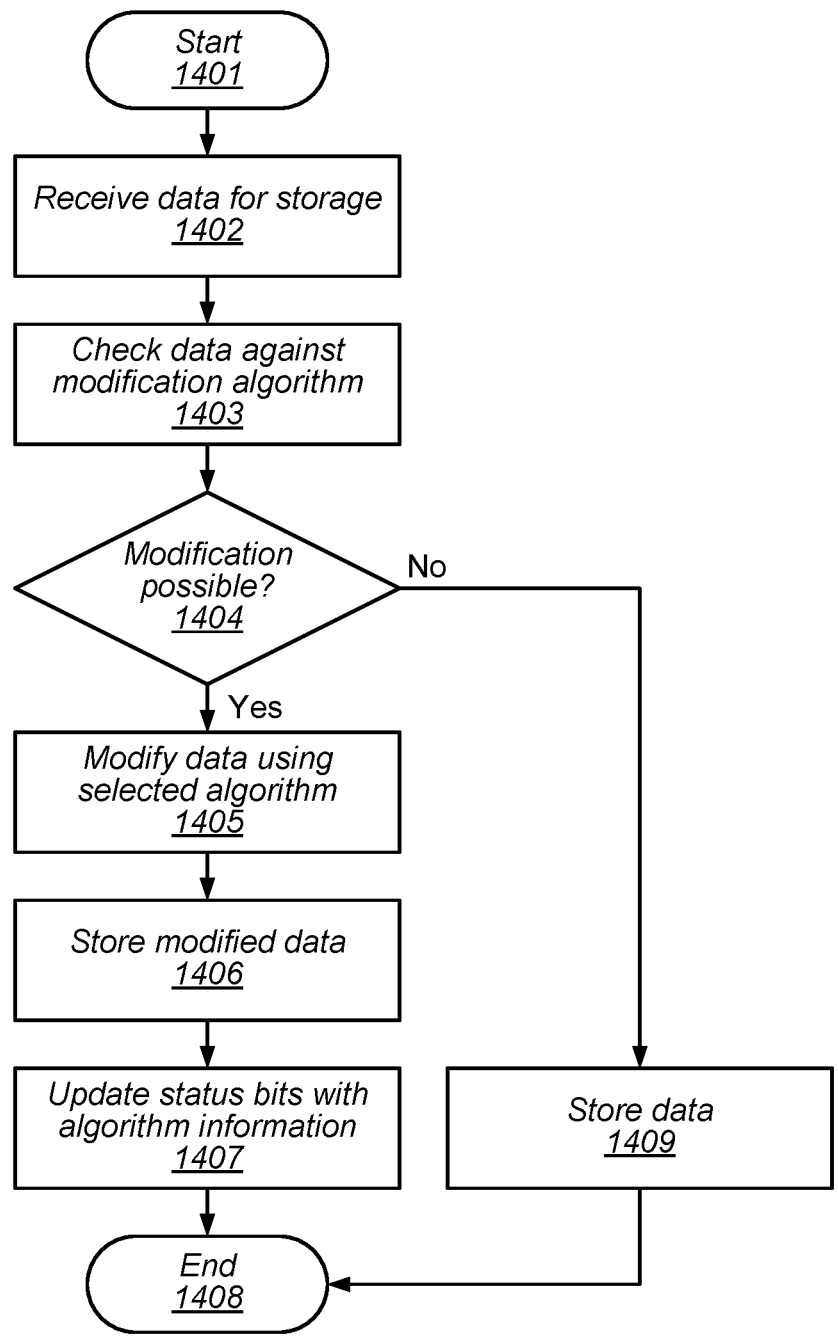
FIG. 14 illustrates a flow diagram depicting an embodiment of a method for modifying data prior to storage in a memory circuit.

It is noted that the embodiment of the method depicted in the flow diagram of FIG. 14 is merely an example. In other embodiments, different operations and different orders of operations are possible and contemplated.

The aforementioned circuits and procedures may also be applied to other types of data than sparse data. For example, data to be stored in a memory circuit, may be compressed in response to a detection of repeated data bits included in the data. A method for performing such compression is depicted in the flow diagram of FIG. 15. The method begins in block 1501.

Data may then be received for storage (block 1502). In various embodiments, a data control circuit, such as, e.g., data control circuit 103, may receive the data as part of a memory write operation.

The received data may then be checked for repeated data bits (block 1503). The data control circuit may, in various embodiments, sequential check the received data to determine sequences of repeated data bits. In some embodiments, a programmable threshold value indicating a minimum number of repeated data bit that constitutes a sequence of repeated data bits. The method may then depend on a result of the check (block 1504).

If the data control circuit detects at least one sequence of repeated data bits, then the data is compressed (block 1505). In various embodiments, the data control circuit may perform run-length encoding, or any other suitable type of encoding, to compress the received data to generate compressed data.

Upon completion of the compression, the compressed data may then be stored in a particular region of the memory circuit (block 1506). The particular region may, in some embodiments, correspond to a block, sub-block, or other portion of the memory circuit designated for storing compressed data.

Status bits associated with an address corresponding to the received data may then be updated (block 1507). In some embodiments, a sparse array circuit, such as, e.g., sparse array circuit 102, may update status bits in a particular entry corresponding to the address. The status bits may be updated to include information indicative of how the compression of the data was performed to allow for proper decompression when the data is retrieved from the memory.

Alternatively, the no sequences of repeated data are detected in the received data, then the received data may be stored in the memory circuit (block 1509). In various embodiments, the received data may be stored in a location within the memory circuit based on the address corresponding to the received data. The method may then conclude in block 1508.

Figure 15:
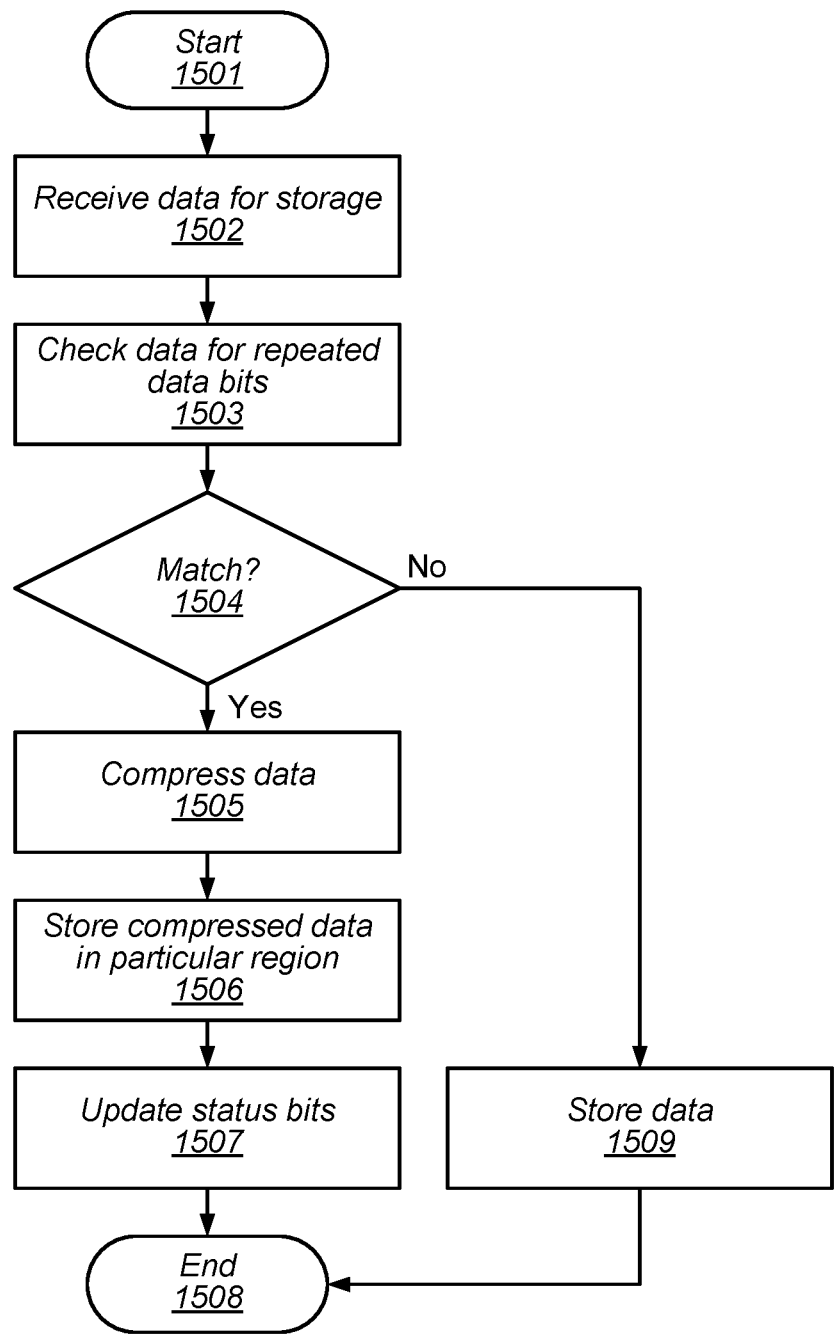
FIG. 15 illustrates a flow diagram depicting an embodiment of a method for compressing data prior to storage in a memory circuit.

It is noted that the embodiment illustrated in the flow diagram of FIG. 15 is merely an example. In other embodiments, different operations may be employed.

Figure 16:
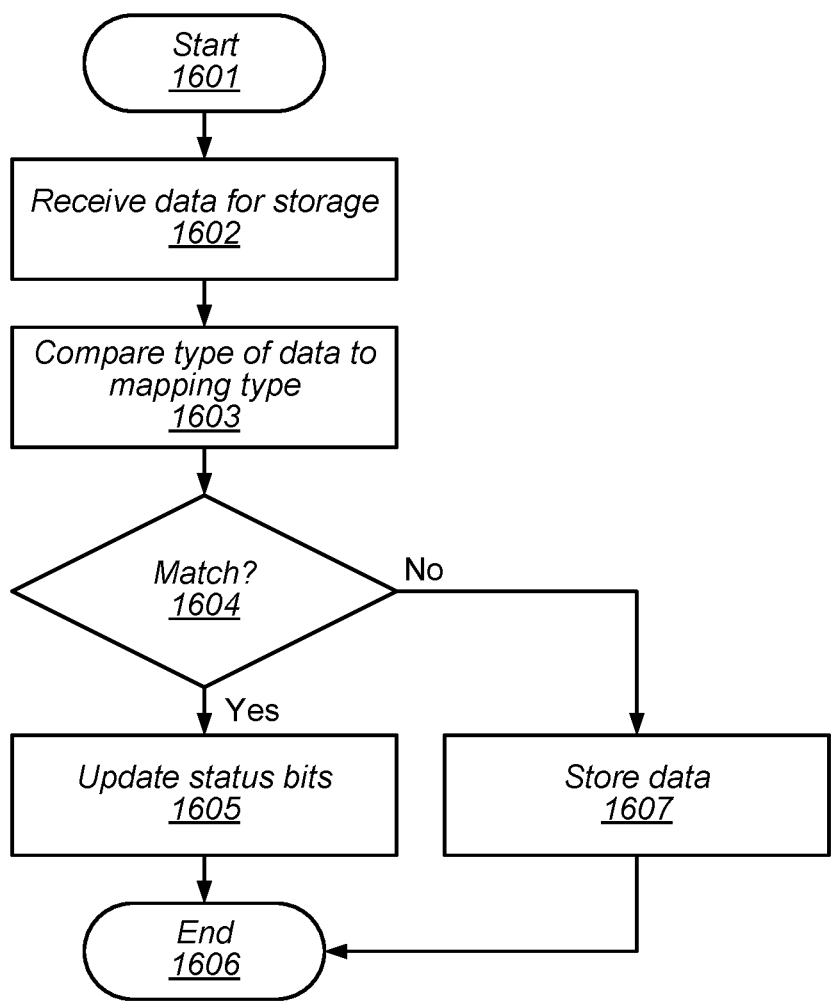
FIG. 16 illustrates a flow diagram depicting an embodiment of a method for storing data in a memory circuit based on a type of data.

As described above, during data storage, sparse data may be identified and then additional steps taken as part of the data storage process. Such a procedure need not be limited to sparse data. In some cases, a particular type of data may be identified during a storage operation in a memory, and treated in a different fashion. For example, certain types of graphics data may be repeated used to generate an image on a display or other screen. Such data may be identified as it is stored in a memory, which may invoke alternative storage operations. An embodiment of a method for storing data in a memory circuit is illustrated in FIG. 16. The method begins in block 1601.

Data, and an associated address, may then be received for storage in a memory circuit (block 1602). In various embodiments, the address may be received by a sparse array circuit, such as, e.g., sparse array circuit 102, and the data may be received by a data control circuit, such as data control circuit 103, for example.

The type of data may then be compared to a mapping type (block 1603). In some embodiments, the data control circuit may compare information encoded in meta data associated with the received data to determine if the type of the received data matches the mapping type. The method may then depend on a result of the comparison (block 1604).

If the type of data matches the mapping type, then status bits associated with the address corresponding to the received data may be updated to indicate the match (block 1605). By updating the status bits of the address corresponding to the received data, the data may, in response to a memory read operation, be quickly retrieved based on the contents of an entry in the sparse array circuit as opposed performing a complete read operation. The method may then conclude in block 1606.

Alternatively, the type of the received data does not match the mapping type, then the data may be stored in the memory circuit (block 1607). The method may then conclude in block 1606.

The embodiment depicted in the flow diagram illustrated in FIG. 16 is merely an example. Different operations and different orders of operations may be used in other embodiments.

As described above, sparse data may be collected so that it resides in a particular region within a memory circuit. When data is stored in this fashion, decoding of addresses used for memory accesses may be performed in stages, with some stages being omitted under certain circumstances. By omitting some stages of address decode, power dissipation associated with decoding addresses may be reduced, in various embodiments. An embodiment of a method for decoding addresses during a memory access is depicted in the flow diagram of FIG. 17. The method begins in block 1701.

An address may then be received by a memory circuit as part of a memory read operation (block 1702). In various embodiments, the address may be received by decoder circuit, such as decoder circuit 403, for example.

A portion of the received address may then be decoded (block 1703). The received address may include multiple data bits. Depending on the architecture of a particular memory circuit, different groups of bits may correspond to different physical locations within the particular memory circuit. For example, several of the most-significant-bits (MSBs) may correspond to which block of multiple blocks included in the particular memory circuit. In various embodiments, the portion of the address associated with selecting a particular block included in the memory circuit, may be decoded as part of the operation described in block 1703. The method may then depend on a result of decoding the portion of the address (block 1704).

If the decoded portion of the address points to a sparse region, then further decode of the address is aborted (block 1705). In various embodiments, the decoded portion of the address is compared to information stored in a sparse array circuit, such as, e.g., sparse array circuit 102, to determine is the decoded portion of the address points to a region designated for storing sparse data.

Data may be transmitted based on the status bits associated with the region associated with the decoded portion of the address (block 1706). In some embodiments, the transmitted data may correspond to sparse data or a particular data pattern stored in the selected region. A data control circuit, such as data control circuit 103, may transmit the data based on the status bits. It is noted that when the rest of the address decode is aborted, other operations associated with the memory access, such as, e.g., the generation of timing signals for operating sense amplifiers, may also be halted. The method may then concluded in block 1707.

Alternatively, if the decoded portion of the address does not map to a region designated for storing sparse data, then the rest of the address may be decoded (block 1708). The method may then depend on results of the rest of the address decoding (block 1709).

If the rest of the decoded address, in conjunction with the previously decoded portion of the address, points to a location in memory designated for storing sparse data then the method may continue from block 1706 as described above. Alternatively, if the rest of the decoded address, along with the previously decoded portion of the address, does not point to a location within the memory circuit that is designated for storing sparse data, then the memory circuit performs the memory read operation, and transmits the data retrieved from the selected data storage cells (block 1710).

Figure 17:
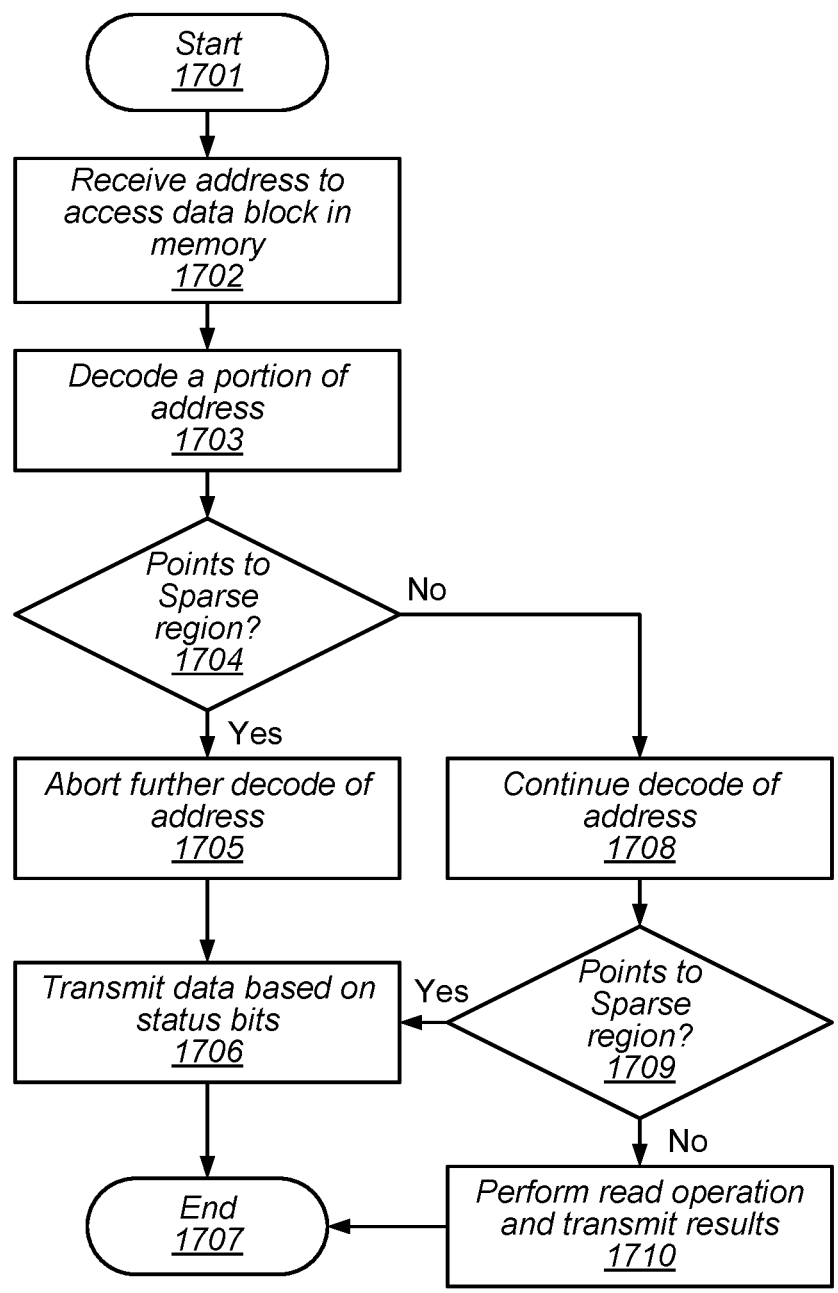
FIG. 17 illustrates a flow diagram depicting an embodiment of a method for decoding addresses in a memory circuit as part of a read operation.

Although two stages of address decode are depicted in the embodiment depicted in the flow diagram of FIG. 17, in other embodiments, any suitable number of stages of address decode, with a check for the decoded stages pointing to designated sparse regions, may be employed.

Figure 18:
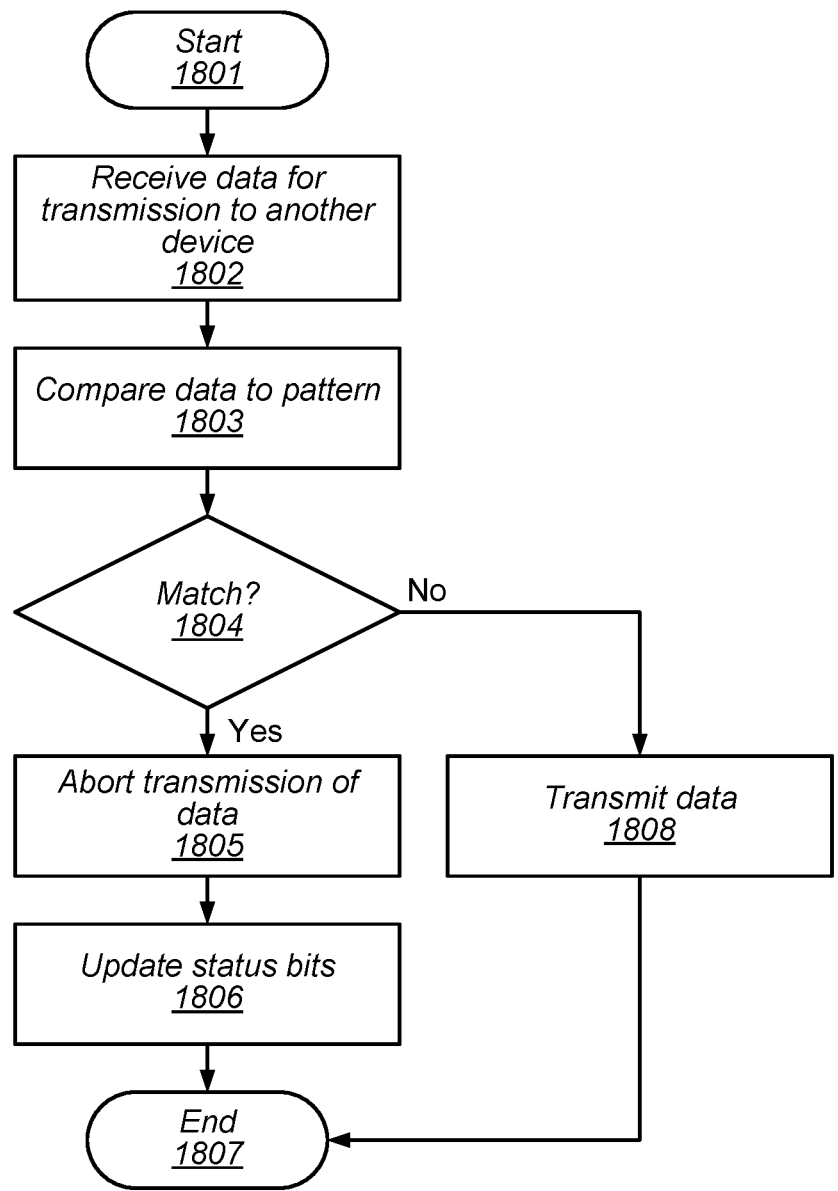
FIG. 18 illustrates a flow diagram depicting an embodiment of a method for transmitting data between devices in a computing system.

In addition to modifying accesses to memory circuits based upon the detection of sparse data, the transmission of data between devices may also be modified based upon the detection of sparse data. An embodiment of a method for transmitting data between devices is depicted in FIG. 18. Referring collectively to FIG. 7 and the flow diagram of FIG. 18, the method begins in block 1801.

Sparse circuit 704 may then receive data from circuit block 703 for transmission (block 1802). In various embodiments, the data may be received in response to a request from a device, such as device 702, for example.

The received data may then be compared to a particular data pattern (block 1803). In various embodiments, sparse circuit 704 may perform a bitwise comparison between the received data and the particular data pattern. In some cases, the particular data pattern may correspond to sparse data. The method may then depend on a result of the comparison (block 1804).

If the received data matches the particular data pattern, then transmission of the data is aborted (block 1805). Transceiver circuit 705 may, in some embodiments, abort the transmission of the received data. Sparse circuit 704 may then update status bits associated with the received data (block 1806). In some cases, transceiver circuit 705 may transmit one or more signals via communication bus 706 indicative of the status bits as opposed to transmitting the actual received data. The method may then conclude in block 1807.

Alternatively, if the received data does not match the particular pattern, then transceiver circuit 705 may transmit the received data (block 1808). With the transmission of the received data, the method may conclude in block 1807.

It is noted that the embodiment depicted in FIG. 18 is merely an example, and that, in other embodiments, different operations and different orders of operations are possible and contemplated.

In addition to identifying sparse data patterns, similar techniques may be used to detect other data patterns in data to be stored in a memory. Such other data patterns may include sensitive data, such as, e.g., passwords, that can be further processed to obfuscate the data prior to storage. An embodiment of a method for obfuscating data prior to storage in a memory is depicted in the flow diagram of FIG. 19. The method begins in block 1901.

As described above, data for storage may then be received (block 1902). The received data may then be compared to a security pattern (block 1903). In various embodiments, data control circuit 103 may perform a bitwise comparison of the received data with the security data pattern. The method may then depend on a result of the comparison (block 1904).

If the received data matches the security data pattern, then memory circuit 101 may store obfuscated data at a location corresponding to the address associated with the received data (block 1905). In some embodiments, the obfuscated data may be generated using the received data and based upon a particular algorithm. Alternatively, the obfuscated data may be predetermined.

Status bits associated with the received data may then be updated (block 1906). In various embodiments, the status bits may be included in an entry in sparse array circuit 102 that corresponds to the address associated with the received data. Once the status bits have been updated, the method may conclude in block 1907.

Alternatively, if the received data fails to match the security data pattern, the data may be stored in memory circuit 101 (1908). Once the data has been stored, the method may conclude in block 1907.

Figure 19:
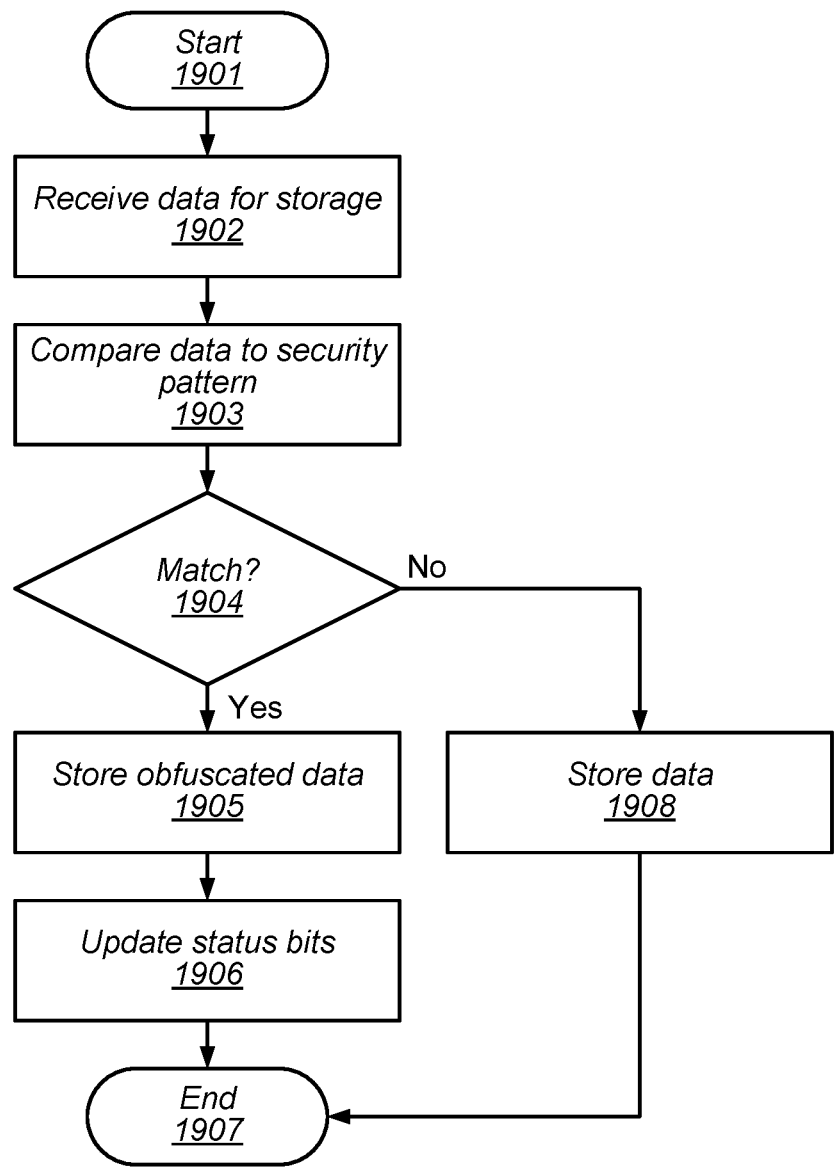
FIG. 19 illustrates a flow diagram depicting an embodiment of a method for storing data in a memory circuit in a secure fashion.

It is noted that the embodiment of the method depicted in FIG. 19 is merely an example. In other embodiments, different operations may be employed.

As described above, when accessing sparse data in a memory circuit, the sparse pattern is already known, a clock signal that provides timing information to data capture circuits coupled to the memory may be halted to reduce power dissipation of the data capture circuits. An embodiment of a method for clock gating data capture circuits is illustrated in the flow diagram of FIG. 20. The method begins in block 2001.

A memory circuit, such as, e.g., memory circuit 101 may then be accessed (block 2002). During an access, an address may be sent to the memory circuit, and a sparse array circuit, such as, e.g., sparse array circuit 102 may check the received address against previously stored entries to determine if the received address corresponds to sparse data. The method may then depend on whether the data corresponding to the received address is sparse data (block 2003).

If the received address corresponds to sparse data, then the clock signals coupled to data capture circuits may be disabled (block 2004). For example, local clock signal 807 may be disabled based on status bit 804, so that regardless of the state of clock signal 805, local clock signal 807 is held static. By halting local clock signal 807, power consumption inside flip-flop circuit 801 associated with transitions of local clock signal 807 may, in various embodiments, be reduced. The method may then conclude in block 2005.

Figure 20:
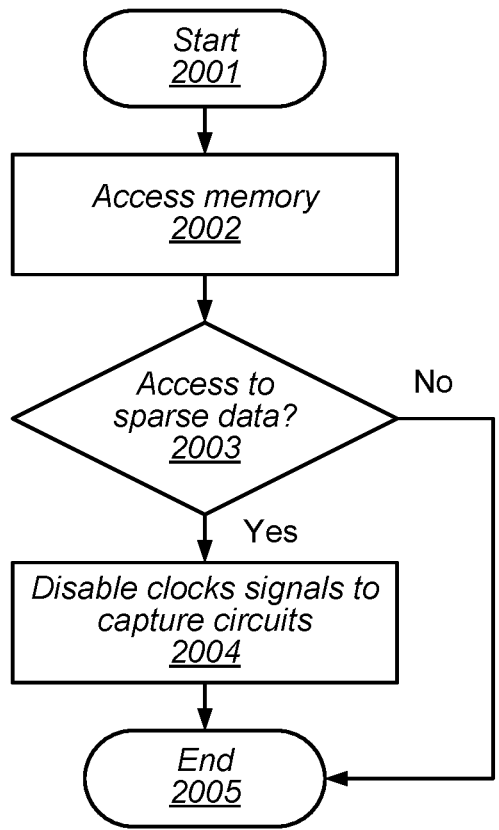
FIG. 20 illustrates a flow diagram depicting an embodiment of a method for clock gating data capture circuits coupled to a memory circuit.

Alternatively, if the received address does not correspond to sparse data, then the method may conclude in block 2005. It is noted that the embodiment of the method depicted in the flow diagram of FIG. 20 is merely an example. In other embodiments, different operations and different orders of operations are possible and contemplated.

Figure 21:
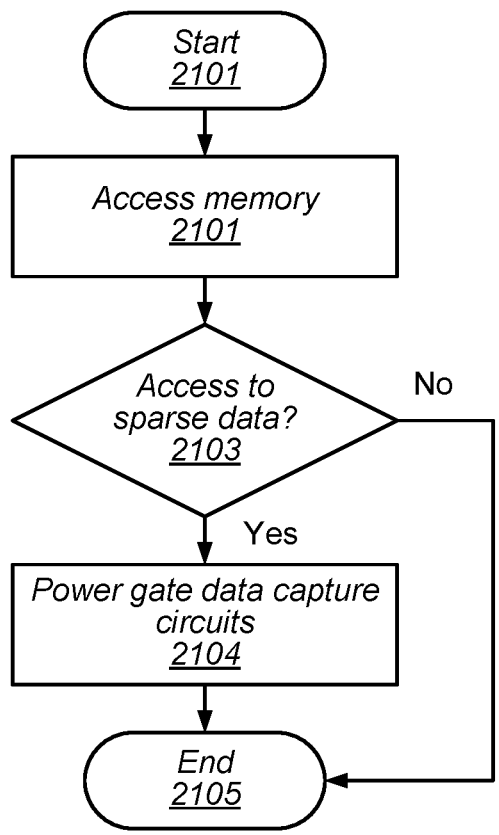
FIG. 21 illustrates a flow diagram depicting an embodiment of a method for power gating data capture circuits coupled to a memory circuit.

Just as data capture circuits may be clock gated when sparse data is being retrieved from a memory circuit, such data capture circuits may also be power gated upon the retrieval of sparse data from the memory circuit. An embodiment of a method for gating the power to such data capture circuits is illustrated in FIG. 21. The method begins in block 2101.

A memory circuit, such as, e.g., memory circuit 101 may then be accessed (block 2102). During an access, an address may be sent to the memory circuit, and a sparse array circuit, such as, e.g., sparse array circuit 102 may check the received address against previously stored entries to determine if the received address corresponds to sparse data. The method may then depend on whether the data corresponding to the received address is sparse data (block 2103).

If the received address is associated with sparse data, then data capture circuits, such as, e.g., flip-flop circuit 901, may be power gated (block 2104). In various embodiments, a power gating circuit, such as power gating circuit 902, may decouple power supply nodes included in a flip-flop or other data capture circuit based on status bits generated by a sparse array circuit, such as sparse array circuit 102, for example. The method may then conclude in block 2105.

Alternatively, if the received address does not correspond to sparse data, then the method may conclude in block 2105. It is noted that the embodiment illustrated in the flow diagram of FIG. 21 is merely an example. In other embodiments, different operations and different orders of operations may be employed.

Figure 22:
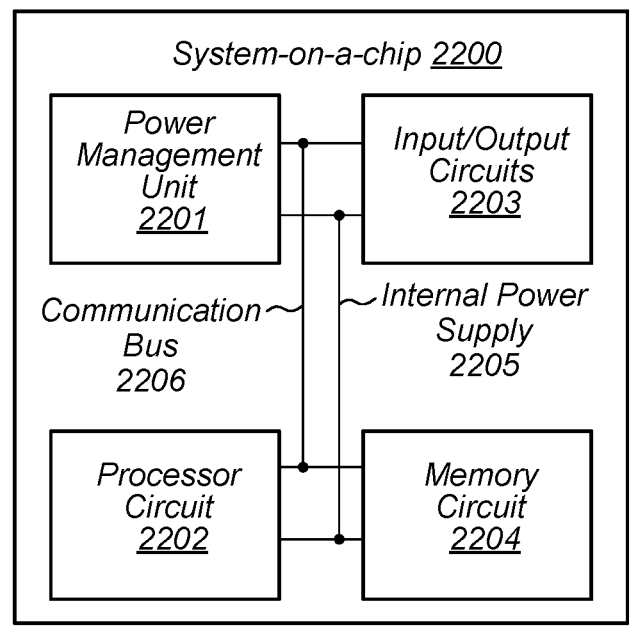
FIG. 22 depicts a block diagram of an embodiment of system-on-a-chip.

A block diagram of system-on-a-chip (SoC) is illustrated in FIG. 22. In the illustrated embodiment, the SoC 2200 includes power management unit 2201, processor circuit 2202, Input/Output circuits 2203, and memory circuit 2204, each of which may be configured to send requests and data (collectively transactions) the other circuit blocks using communication bus 2206. In various embodiments, SoC 2200 may be configured for use in a desktop computer, server, or in a mobile computing application such as, e.g., a tablet, laptop computer, or wearable computing device.

Power management unit 2201 may be configured to generate a regulated voltage level on internal power supply 2205 in order to provide power to processor circuit 2202, input/output circuits 2203, and memory circuit 2204. In various embodiments, power management unit 2201 may include one or more voltage regulator circuits configured to generate the regulated voltage level based on an external power supply (not shown). It is noted that although a single internal power supply is depicted in the embodiment of FIG. 22, in other embodiments any suitable number of internal power supplies may be employed.

Processor circuit 2202 may, in various embodiments, be representative of a general-purpose processor that performs computational operations. For example, processor circuit 2202 may be a central processing unit (CPU) such as a microprocessor, a microcontroller, an application-specific integrated circuit (ASIC), or a field-programmable gate array (FPGA).

Memory circuit 2204 may correspond to memory circuit 101 as illustrated in FIG. 1, In various embodiments, memory circuit 2204 may include any suitable type of memory such as a Dynamic Random Access Memory (DRAM), a Static Random Access Memory (SRAM), a Read-only Memory (ROM), Electrically Erasable Programmable Read-only Memory (EEPROM), or a non-volatile memory, for example. It is noted that in the embodiment of an integrated circuit illustrated in FIG. 22, a single memory circuit is depicted. In other embodiments, any suitable number of memory circuits may be employed.

Input/output circuits 2203 may be configured to coordinate data transfer between SoC 2200 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 2203 may be configured to implement a version of Universal Serial Bus (USB) protocol or IEEE 1394 (Firewire®) protocol.

Input/output circuits 2203 may also be configured to coordinate data transfer between SoC 2200 and one or more devices (e.g., other computing systems or integrated circuits) coupled to SoC 2200 via a network. In one embodiment, input/output circuits 2203 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 2203 may be configured to implement multiple discrete network interface ports.

Figure 23:
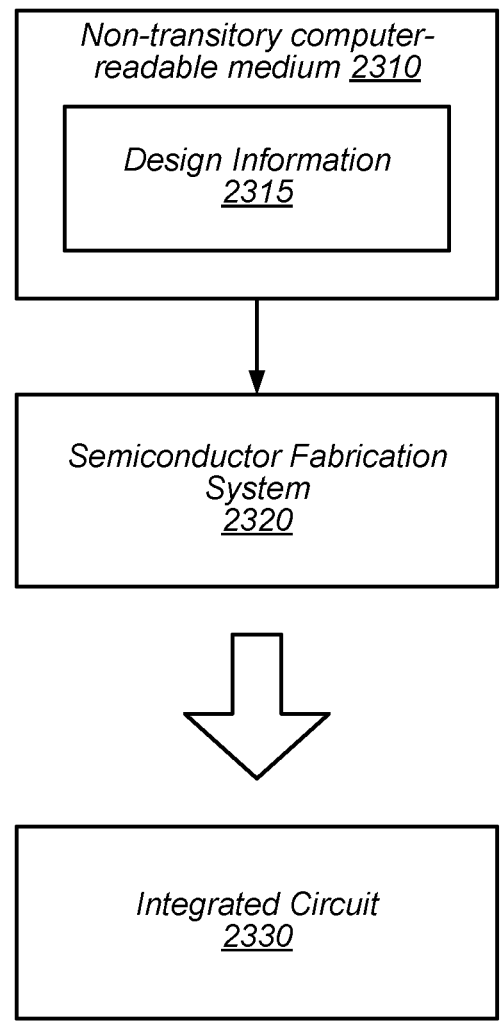
FIG. 23 illustrates a block diagram of a computer-readable medium storing design information for an integrated circuit.

FIG. 23 is a block diagram illustrating an example non-transitory computer-readable storage medium that stores circuit design information, according to some embodiments. In the illustrated embodiment, semiconductor fabrication system 2320 is configured to process the design information 2315 stored on non-transitory computer-readable storage medium 2310 and fabricate integrated circuit 2330 based on the design information 2315.

Non-transitory computer-readable storage medium 2310, may comprise any of various appropriate types of memory devices or storage devices. Non-transitory computer-readable storage medium 2310 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 2310 may include other types of non-transitory memory as well or combinations thereof. Non-transitory computer-readable storage medium 2310 may include two or more memory mediums which may reside in different locations, e.g., in different computer systems that are connected over a network.

Design information 2315 may be specified using any of various appropriate computer languages, including hardware description languages such as, without limitation: VHDL, Verilog, SystemC, SystemVerilog, RHDL, M, MyHDL, etc. Design information 2315 may be usable by semiconductor fabrication system 2320 to fabricate at least a portion of integrated circuit 2330. The format of design information 2315 may be recognized by at least one semiconductor fabrication system, such as semiconductor fabrication system 2320, for example. In some embodiments, design information 2315 may include a netlist that specifies elements of a cell library, as well as their connectivity. One or more cell libraries used during logic synthesis of circuits included in integrated circuit 2330 may also be included in design information 2315. Such cell libraries may include information indicative of device or transistor level netlists, mask design data, characterization data, and the like, of cells included in the cell library.

Integrated circuit 2330 may, in various embodiments, include one or more custom macrocells, such as memories, analog or mixed-signal circuits, and the like. In such cases, design information 2315 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 2320 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 2320 may also be configured to perform various testing of fabricated circuits for correct operation.

In various embodiments, integrated circuit 2330 is configured to operate according to a circuit design specified by design information 2315, which may include performing any of the functionality described herein. For example, integrated circuit 2330 may include any of various elements shown or described herein. Further, integrated circuit 2330 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Some memory circuits include data storage cells that require periodic refreshing of the data stored in the data storage cells. Such memory circuits are referred to as "dynamic memories." When a dynamic memory is not being read from or written to, internal control circuits may perform refresh operations data storage cells included in the memory circuit in order for the data storage cells to maintain their stored data. Refresh operations may perform many of the same steps associated with a read or write operation, resulting in power consumption similar to read or write operations.

Figure 24:
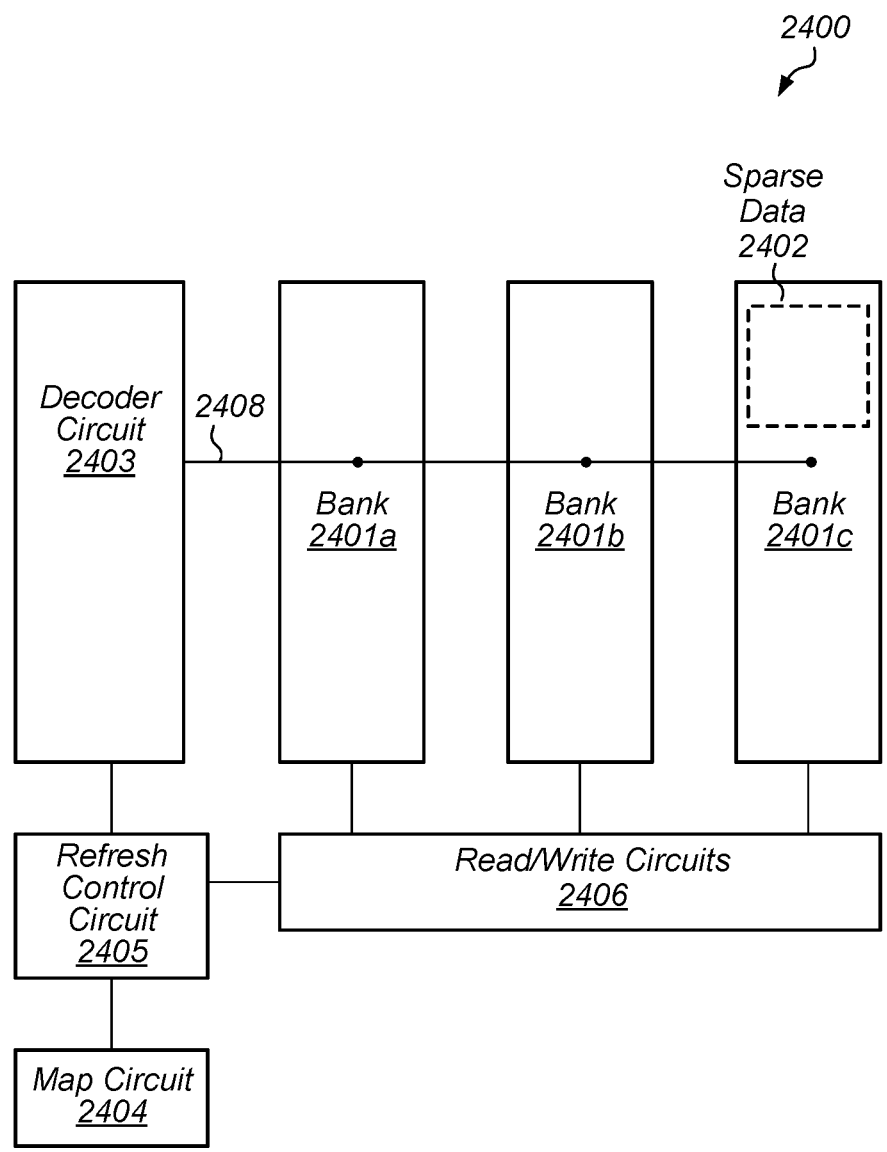
FIG. 24 illustrates a block diagram of a memory circuit that includes a refresh control circuit.

An embodiment of a dynamic memory including a refresh control circuit is illustrated in the block diagram of FIG. 24.

Memory circuit 2400 includes bank 2401*a* through bank 2401*c*, decoder circuit 2403, refresh control circuit 2405, map circuit 2404, and read/write circuits 2406.

Each of bank 2401*a* through bank 2401*c* includes multiple data storage cells. In various embodiments, the data storage cells may be dynamic data storage cells that storage charge indicative of a particular data state in a capacitor. In the present embodiment, bank 2401*c* includes data storage cells that store sparse data 2402, which may correspond to a logical-0 data value. Although only three banks are depicted in the embodiment of FIG. 24, in other embodiments, any suitable number of banks may be employed.

Decoder circuit 2403 is configured to generate decoder signals 2408 using input from refresh control circuit 2405. In various embodiments, decoder circuit 2403 may generate both row and column decode signals use to activate particular bank and data storage cells included in the banks as part of read, write, and refresh operations.

In some embodiments, decoder circuit 2403 may include multiple static of dynamic logic circuit configured to generate the decoder signals. In some cases, decoder circuit 2403 may also use one or more timing or internal clock signals (not shown) included in memory circuit 2400 to generate the decoder signals.

Read/Write circuits 2406 are configured to sense data generated by selected data storage cells in banks 2401*a* through 2401*c*, and the restore the sensed data to the selected data storage cells during a refresh operation. In various embodiments, read/write circuits 2406 include multiple sense amplifier circuits and write driver circuits that are employed to sense and restore data associated with the selected data storage cells.

Map circuit 2404 is configured to store multiple addresses that correspond to storage locations where sparse data, such as, e.g., sparse data 2402 is stored. In various embodiments, the addresses stored in map circuit 2404 are updated during write operations to memory circuit 2400. In some embodiments, map circuit 2404 may correspond to map circuit 404 as illustrated in the embodiment of FIG. 4. Map circuit 2404 may, in various embodiment, include multiple data storage circuits, such as, latch circuits, flip-flop circuits, or other suitable storage circuits.

Refresh control circuit 2405 is configured to generate addresses that correspond to locations of data storage cells in banks 2401*a*-2401*c* that are to be refreshed. In some embodiments, refresh control circuit 2405 may compare a generated address to addresses stored in map circuit 2404. When a generated address matches an address in map circuit 2404, the generated address corresponds to sparse data. In such cases, refresh control circuit 2405 may abort the refresh of data storage cells associated with the matching address since it is known that the data is sparse. By aborting the refresh of addresses that correspond to sparse data, power consumption resulting from the operation of decoder circuit 2403 and read/write circuits 2406 may be reduced or eliminated, thereby reducing overall power consumption of a computer system.

Figure 25:
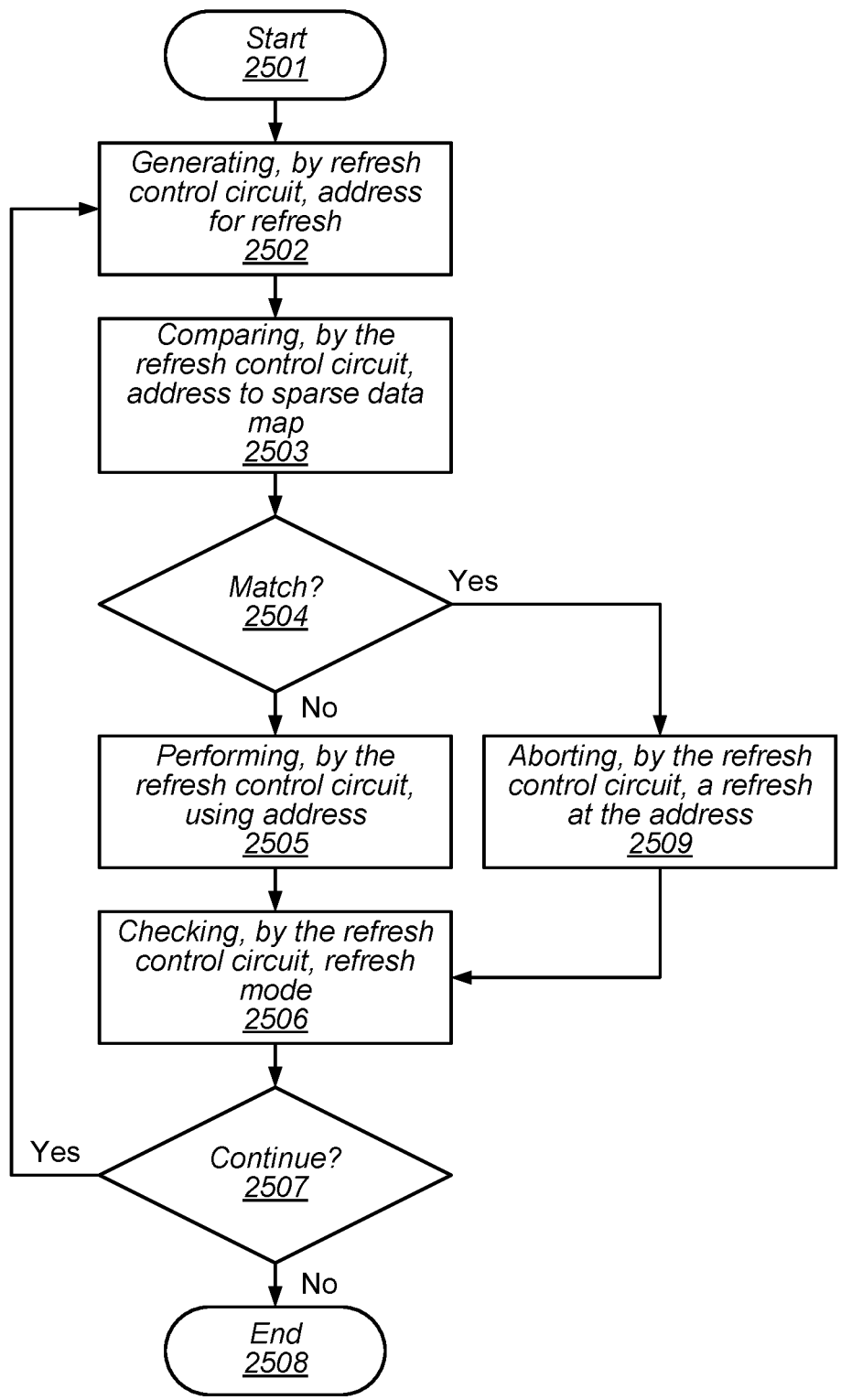
FIG. 25 illustrates a flow diagram that depicts an embodiment of a method for refreshing a memory circuit.

Turning to FIG. 25, a flow diagram depicting an embodiment of a method for performing a refresh operation in a memory circuit. Referring collectively to the embodiment of FIG. 24, and the flow diagram of FIG. 25, the method begins in block 2501.

Refresh control circuit 2405 may then generate an address for refresh (block 2502). In various embodiment, refresh control circuit 2405 may increment a counter, or execute software or program instructions, to generate the address for refresh. \

The address may then be compared to a sparse data map, such as is stored in map circuit 2404, by refresh control circuit 2405 (block 2503). In various embodiments, refresh control circuit 2405 may compare each address included in the sparse data map to the generated address using a bitwise exclusive-OR operation, or other suitable Boolean operation. In other cases, map circuit 2404 may include a content addressable memory to facilitate comparing the generated address to the sparse data map. The operation then depends on the outcome of the comparison (block 2504).

If the generated address does not match an address in the sparse data map, then refresh control circuit 2405 performs a refresh operation using the generated address (block 2505). In various embodiments, performing the refresh operation includes decoding the generated address, activating row and column select lines, sensing data from selected data storage cells, and writing the sensed data back into the selected data storage cells.

Refresh control circuit 2405 may then check a refresh mode of memory circuit 2400 (block 2506). The operation then depends on results on checking the refresh mode (block 2507). If the refresh mode is no longer active and that refresh operations are not to continue, the method concludes in block 2508. Alternatively, if the refresh mode is still active, the method may continue from block 2502 as described above.

Returning to block 2504, if the generated address matches an address in the sparse data map, then refresh circuit 2405 aborts a refresh operation at the generated address (block 2509). The method may then continue from block 2506 as described above.

It is noted that the embodiment of the method illustrated in the flow diagram of FIG. 25 is merely an example. In other embodiments, different operations and different orders of operations are possible and contemplated.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
 a memory circuit including a plurality of banks; and
 a control circuit configured to:
   receive first data for storage in the memory circuit;
   compare the first data to a security pattern;
   select, based on the first data, a particular modification algorithm from a plurality of modification algorithms;

modify, according to the particular modification algorithm, the first data to generate obfuscated data; and in response to a determination that the first data matches the security pattern, store the obfuscated data at a first storage location in the memory circuit specified by a first address associated with the first data.

2. The apparatus of claim 1, wherein the control circuit is further configured to update one or more status bits associated with the first data received for storage, wherein the one or more status bits encode information indicating the obfuscated data has been stored at the first storage location.

3. The apparatus of claim 1, wherein to compare the first data to the security pattern, the control circuit is further configured to perform a bitwise comparison of the first data to the security pattern.

4. The apparatus of claim 1, wherein the control circuit is further configured to:

receive second data for storage;

compare the second data to the security pattern; and in response to a determination that the second data does not match the security pattern, store the second data at a second storage location in the memory circuit specified by a second address associated with the second data.

5. A method, comprising:

receiving, by a memory circuit, first data for storage;

comparing, by the memory circuit, the first data to a security pattern;

selecting, based on the first data, a particular modification algorithm from a plurality of modification algorithms;

modifying, according to the particular modification algorithm, the first data to generate obfuscated data; and in response to determining that the first data matches the security pattern, storing the obfuscated data at a first storage location specified by a first address associated with the first data.

6. The method of claim 5, further comprising updating, by the memory circuit, one or more status bits associated with the first data received for storage, wherein the one or more status bits encode information indicating the obfuscated data has been stored at the first storage location.

7. The method of claim 5, wherein comparing the first data to the security pattern includes performing a bitwise comparison of the first data to the security pattern.

8. The method of claim 5, wherein the obfuscated data includes a predetermined data pattern.

9. The method of claim 5, further comprising:

receiving, by the memory circuit, second data for storage;

comparing, by the memory circuit, the second data to the security pattern; and in response to determining that the second data does not match the security pattern, storing the second data at a second storage location specified by a second address associated with the second data.

10. An apparatus, comprising:

a processor circuit configured to transmit first data; and a memory circuit including a plurality of storage locations, wherein the memory circuit is configured to:

receive first data for storage in the memory circuit;

compare the first data to a security pattern;

select, based on the first data, a particular modification algorithm from a plurality of modification algorithms;

modify, according to the particular modification algorithm, the first data to generate obfuscated data; and in response to a determination that the first data matches the security pattern, store the obfuscated data at a first storage location of the plurality of storage locations specified by a first address associated with the first data.

11. The apparatus of claim 10, wherein the memory circuit is further configured to update one or more status bits associated with the first data received for storage, wherein the one or more status bits encode information indicating the obfuscated data has been stored at the first storage location.

12. The apparatus of claim 10, wherein to compare the first data to the security pattern, the memory circuit is further configured to perform a bitwise comparison of the first data to the security pattern.

13. The apparatus of claim 10, wherein the obfuscated data includes a predetermined data pattern.

14. The apparatus of claim 10, wherein the processor circuit is further configured to transmit second data, and wherein the memory circuit is further configured to:

receive the second data for storage;

compare the second data to the security pattern; and in response to a determination that the second data does not match the security pattern, store the second data at a second storage location of the plurality of storage locations specified by a second address associated with the second data.

* * * * *